United States Patent
Nakamura et al.

(10) Patent No.: US 8,201,329 B2
(45) Date of Patent: Jun. 19, 2012

(54) APPARATUS AND METHOD FOR MANUFACTURING SEMICONDUCTOR DEVICE

(75) Inventors: Osamu Nakamura, Kanagawa (JP); Kyosuke Ito, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 12/792,812

(22) Filed: Jun. 3, 2010

(65) Prior Publication Data

US 2010/0236053 A1 Sep. 23, 2010

Related U.S. Application Data

(63) Continuation of application No. 11/655,173, filed on Jan. 19, 2007, now abandoned.

(30) Foreign Application Priority Data

Feb. 3, 2006 (JP) .................................. 2006-027737

(51) Int. Cl.
| H01R 43/00 | (2006.01) |
| H05K 13/00 | (2006.01) |
| H01L 21/00 | (2006.01) |
| H01L 21/64 | (2006.01) |

(52) U.S. Cl. ........................................ 29/854; 29/25.01
(58) Field of Classification Search ................. 29/25.01, 29/825, 832, 834, 846, 854; 438/99, 115, 438/127, 761, 778, 780, 800
See application file for complete search history.

(56) References Cited

U.S. PATENT DOCUMENTS

| 4,617,722 | A | * | 10/1986 | Willis | 438/61 |
| 5,282,915 | A | * | 2/1994 | Westlake, Jr. | 156/243 |
| 5,757,456 | A | * | 5/1998 | Yamazaki et al. | 349/151 |
| 6,118,502 | A | * | 9/2000 | Yamazaki et al. | 349/45 |
| 6,342,434 | B1 | * | 1/2002 | Miyamoto et al. | 438/464 |
| 6,839,123 | B2 | * | 1/2005 | Nishi et al. | 349/187 |
| 7,020,953 | B2 | * | 4/2006 | Ueno et al. | 29/740 |
| 7,141,451 | B2 | * | 11/2006 | Tsunoda et al. | 438/113 |
| 7,591,863 | B2 | * | 9/2009 | Watanabe et al. | 29/25.01 |
| 7,827,677 | B2 | * | 11/2010 | Ueno et al. | 29/740 |
| 7,851,886 | B2 | * | 12/2010 | Dozen et al. | 257/531 |
| 7,879,654 | B2 | * | 2/2011 | Dozen et al. | 438/123 |
| 8,039,353 | B2 | * | 10/2011 | Dozen et al. | 438/381 |
| 8,043,936 | B2 | * | 10/2011 | Eguchi et al. | 438/458 |
| 8,048,770 | B2 | * | 11/2011 | Eguchi et al. | 438/458 |
| 8,048,777 | B2 | * | 11/2011 | Eguchi et al. | 438/460 |

(Continued)

FOREIGN PATENT DOCUMENTS

EP           1 522 956 A1        4/2005

(Continued)

*Primary Examiner* — David Angwin
(74) *Attorney, Agent, or Firm* — Nixon Peabody LLP; Jeffrey L. Costellia

(57) ABSTRACT

The manufacturing apparatus of a semiconductor device includes a jig having a plurality of holders arranged in a row, a controller for controlling the pitch of the plurality of holders arranged in a row, a support means provided with a plurality of semiconductor integrated circuits, and a support means provided with a substrate having a plurality of elements. By mounting the semiconductor integrated circuits on the respective elements by using the jig having the plurality of holders arranged in a row, semiconductor devices are manufactured.

24 Claims, 19 Drawing Sheets

U.S. PATENT DOCUMENTS

| | | | |
|---|---|---|---|
| 2005/0105039 A1* | 5/2005 | Nishi et al. | 349/187 |
| 2005/0139823 A1* | 6/2005 | Hirakata et al. | 257/40 |
| 2005/0168339 A1* | 8/2005 | Arai et al. | 340/572.8 |
| 2005/0204554 A1* | 9/2005 | Sillner | 29/834 |
| 2006/0011288 A1* | 1/2006 | Watanabe et al. | 156/244.11 |
| 2008/0042168 A1* | 2/2008 | Watanabe et al. | 257/204 |
| 2010/0071207 A1* | 3/2010 | Choi et al. | 29/846 |

FOREIGN PATENT DOCUMENTS

| | | |
|---|---|---|
| EP | 1 553 815 A2 | 7/2005 |
| JP | 62-169423 | 7/1987 |
| JP | 62-274636 | 11/1987 |
| JP | 03-211117 | 9/1991 |
| JP | 10-209222 | 8/1998 |
| JP | 2000-299598 | 10/2000 |
| JP | 2001-274596 | 10/2001 |
| JP | 2004-356376 | 12/2004 |
| JP | 2005-115646 | 4/2005 |
| JP | 2005-522046 | 7/2005 |
| JP | 2005-215754 | 8/2005 |
| WO | WO-01/72097 A2 | 9/2001 |
| WO | WO 2005/119781 A1 | 12/2005 |
| WO | WO 2006/011665 A1 | 2/2006 |

\* cited by examiner

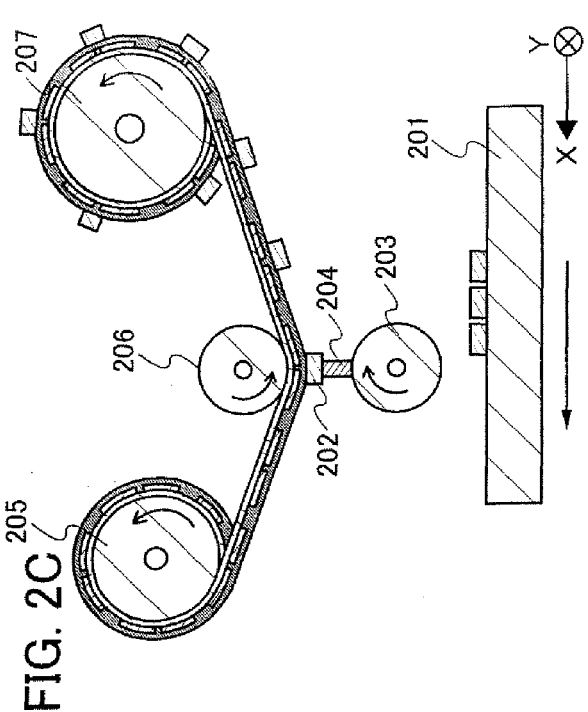
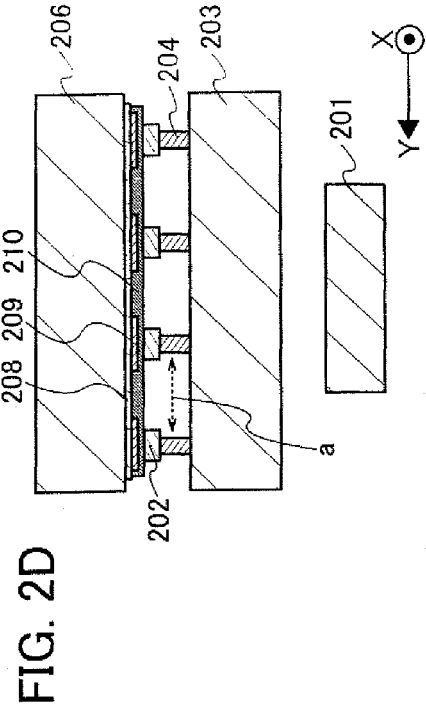
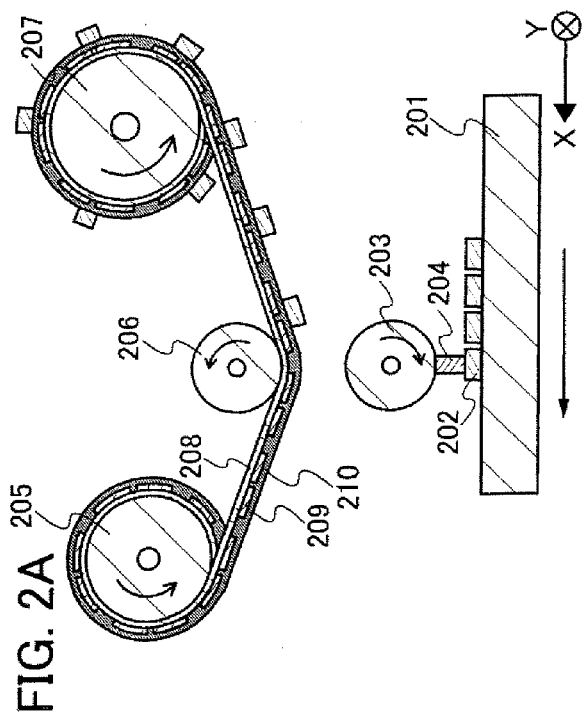
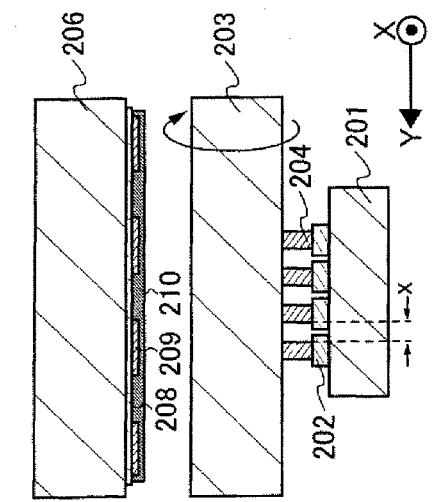

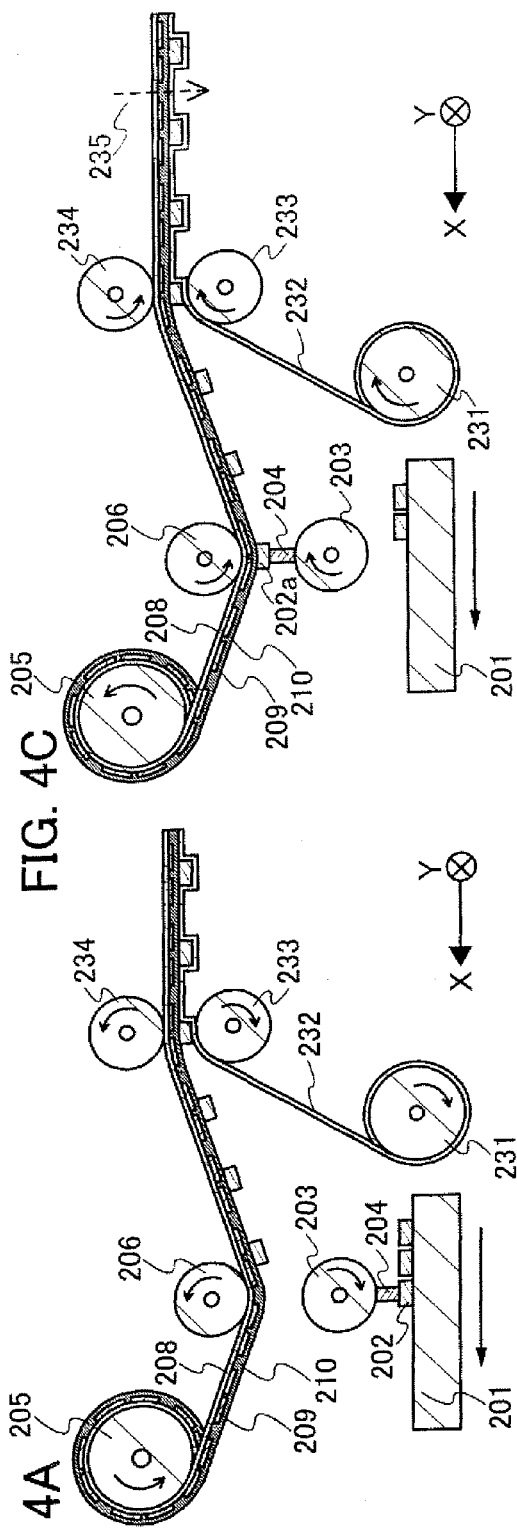
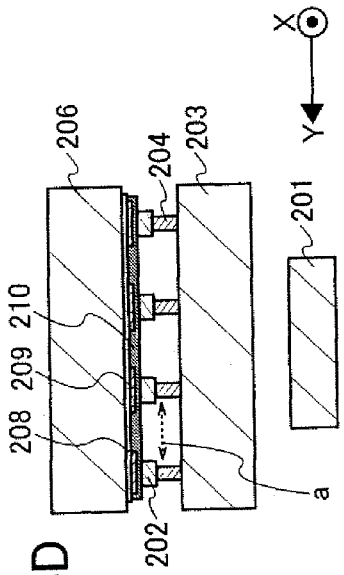
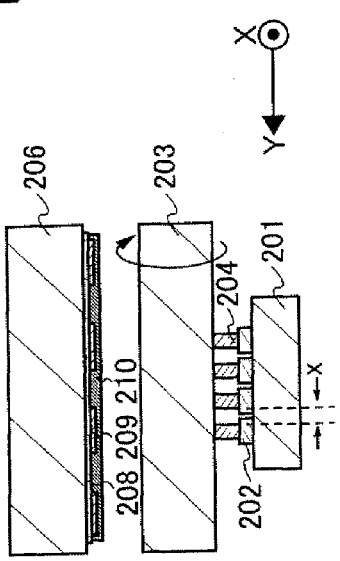

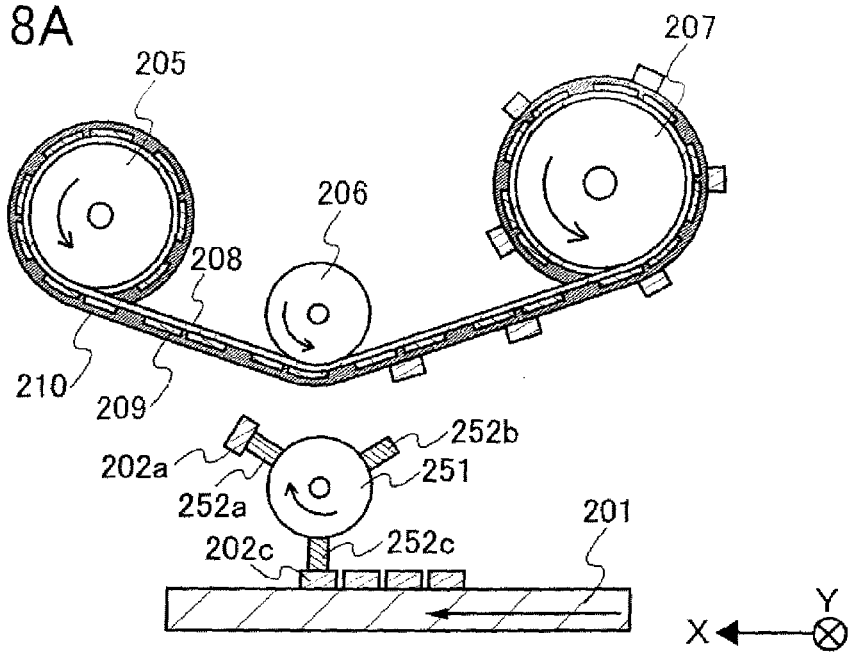
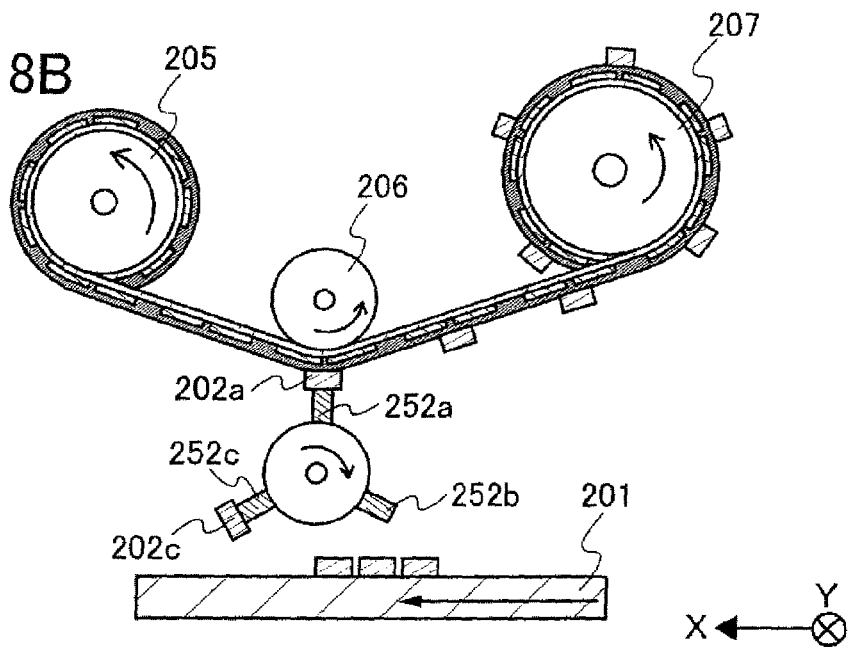

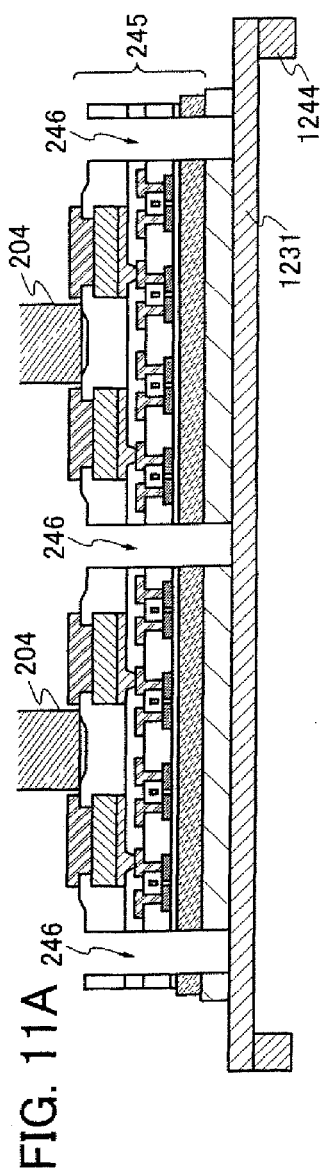
FIG. 11A
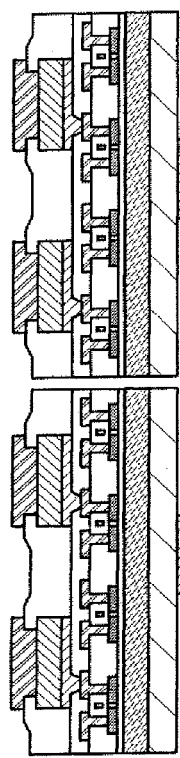
FIG. 11B
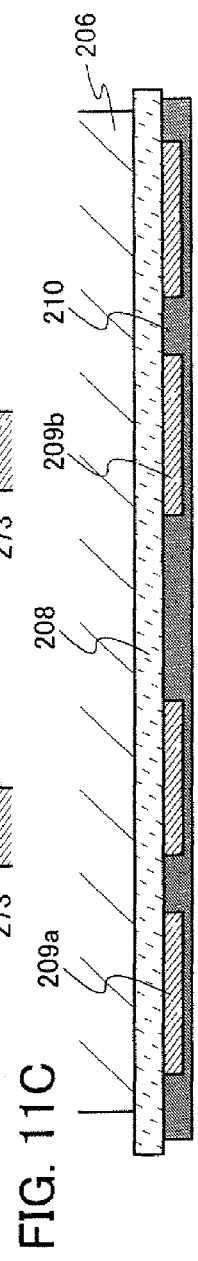
FIG. 11C
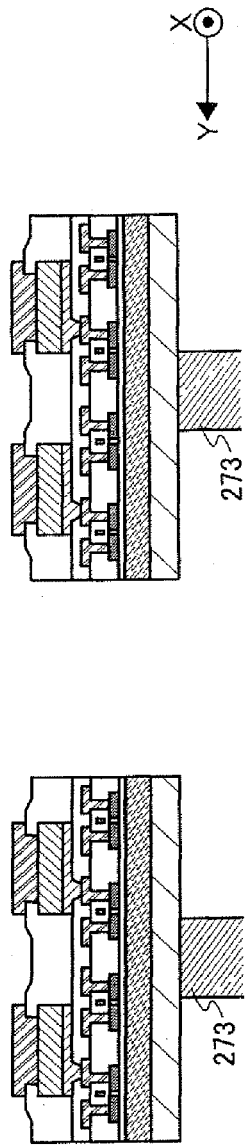

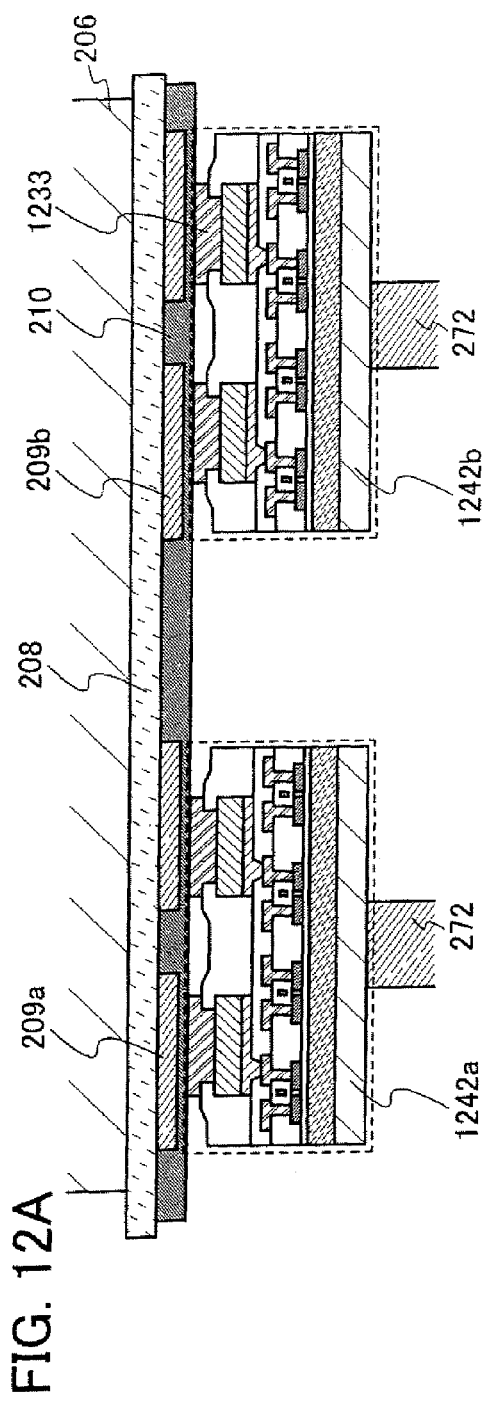
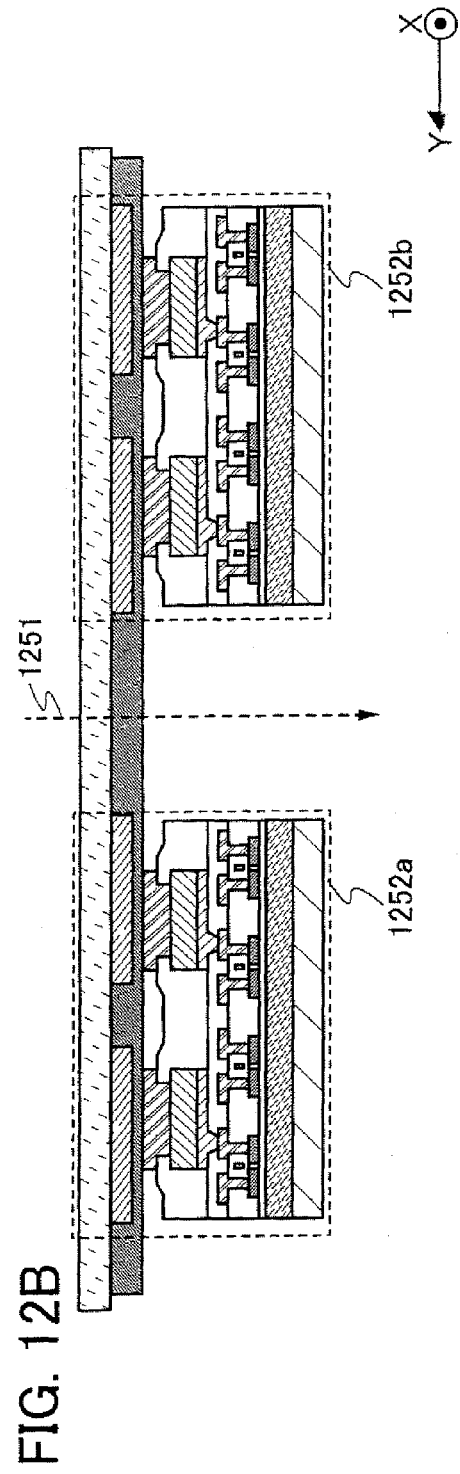

9210

9210

9210

9210

9210

9210

APPARATUS AND METHOD FOR MANUFACTURING SEMICONDUCTOR DEVICE

BACKGROUND OF THE INVENTION

1. Field of the Invention

The present invention relates to a manufacturing apparatus of a semiconductor device. In addition, the invention relates to a manufacturing method of a semiconductor device by which a semiconductor integrated circuit is electrically connected to a circuit (or an element) provided over a substrate (or a flexible substrate). In particular, the invention relates to a manufacturing method of a semiconductor device which performs data input/output by wireless communication via an antenna.

2. Description of the Related Art

A semiconductor device which includes an antenna and a semiconductor integrated circuit electrically connected to the antenna has been drawing attention as an RFID tag. An RFID tag is also called an IC tag, an ID tag, a transponder, an IC chip, or an ID chip. A manufacturing method of an RFID tag is proposed, which includes the steps of providing a plurality of antennas over a flexible substrate, and electrically connecting semiconductor integrated circuits to the plurality of antennas one by one (see Reference 1: Japanese Published Patent Application No. 2005-115646).

In addition, a method which includes the steps of forming a plurality of semiconductor integrated circuits over one substrate (hereinafter also called an element substrate), taking out the plurality of semiconductor integrated circuits one by one, and mounting each semiconductor integrated circuit on a substrate which is different from the element substrate, is proposed (see Reference 2: Japanese Published Patent Application No. 2000-299598).

SUMMARY OF THE INVENTION

In order to reduce cost, it is preferable to form a plurality of semiconductor integrated circuits over an element substrate with high integration density. Meanwhile, an antenna should be formed to have a predetermined shape and size in order to receive electromagnetic waves with a predetermined frequency. Therefore, the pitch of a plurality of semiconductor integrated circuits formed over an element substrate tends to be narrower than that of a plurality of antennas over a flexible substrate. In that case, it has been impossible to electrically connect the plurality of semiconductor integrated circuits formed over the element substrate to the plurality of antennas over the flexible substrate at the same time. Therefore, it has been necessary to repeat the operation of connecting each of the plurality of semiconductor integrated circuits formed over the element substrate to one of the plurality of antennas over the flexible substrate, one by one. Thus, a long tact time is required, which results in high manufacturing cost of the semiconductor device.

In view of the foregoing, it is an object of the invention to provide a manufacturing method of a low-cost semiconductor device, and a manufacturing apparatus capable of manufacturing a semiconductor device at low cost.

It is the gist of the invention to provide a manufacturing apparatus of a semiconductor device, which includes a jig having a plurality of holders arranged in a row; a controller for controlling the pitch of the plurality of holders arranged in a row; a support means provided with a plurality of semiconductor integrated circuits; and a support means provided with a substrate having a plurality of elements. By mounting the semiconductor integrated circuits on the respective elements using the jig having the plurality of holders arranged in a row, semiconductor devices are manufactured.

It is also the gist of the invention to provide a manufacturing apparatus of a semiconductor device, which includes a support means provided with a plurality of semiconductor integrated circuits; a jig having a plurality of holders which are arranged in a row with a pitch of x ($0 \leqq x$) so as to be positioned opposite the respective semiconductor integrated circuits; a controller for controlling the pitch of the plurality of holders arranged in a row; a substrate having a plurality of elements where the pitch of connection terminals of the adjacent elements is a; and a support means for supporting the substrate. The controller changes the pitch of the holders from x to a ($a > x$) so that the semiconductor integrated circuits picked up by the holders can be positioned opposite the respective elements. Then, the semiconductor integrated circuits are mounted on the respective elements by using the jig, thereby semiconductor devices are manufactured.

It is also the gist of the invention to provide a manufacturing method of a semiconductor device, which includes the steps of picking up a plurality of semiconductor integrated circuits by using a jig having a plurality of holders arranged in a row; controlling the pitch of the plurality of holders arranged in a row by a controller for controlling the pitch of the plurality of holders arranged in a row so that connection terminals of the semiconductor integrated circuits can be positioned opposite respective connection terminals of elements; and connecting the connection terminals of the semiconductor integrated circuits to the respective connection terminals of the opposed elements.

It is also the gist of the invention to provide a manufacturing method of a semiconductor device, which includes the steps of picking up a plurality of semiconductor integrated circuits by using a jig having a plurality of holders which are arranged in a row with a pitch of x; changing the pitch of the plurality of holders arranged in a row, from x to a by a controller for controlling the pitch of the plurality holders arranged in a row; and connecting connection terminals of the semiconductor integrated circuits to respective connection terminals of the opposed elements where the pitch of the connection terminals of the adjacent elements is a.

Note that a semiconductor integrated circuit is a circuit including a plurality of semiconductor elements. Typical examples of the semiconductor integrated circuit are a silicon chip on which a plurality of semiconductor elements are formed, a chip having thin film semiconductor elements, and the like. In addition, typical examples of the element are an antenna, a semiconductor integrated circuit, a sensor, a battery, a wiring board, and a display device.

In addition, the invention includes the following.

One aspect of the invention is a manufacturing apparatus of a semiconductor device, which includes a first support means provided with a plurality of semiconductor integrated circuits; a plurality of holders for catching and holding the plurality of semiconductor integrated circuits; a jig having the plurality of holders arranged in a row; a controller for controlling the pitch of the plurality of holders; and a second support means provided with a substrate having a plurality of elements. The jig picks up the plurality of semiconductor integrated circuits provided over the first support means by using the plurality of holders, and mounts the plurality of semiconductor integrated circuits on the plurality of respective elements over the substrate which are provided over the second support means.

Note that the controller moves the plurality of holders arranged in a row so that connection terminals of the plurality of semiconductor integrated circuits can be positioned opposite respective connection terminals of the plurality of elements.

Each of the first support means and the second support means may be a stage, a belt conveyor, or a robot arm.

Alternatively, the first support means may be a stage, a belt conveyor, or a robot arm, while the second support means may be a set of a roller for supplying a flexible substrate having a plurality of elements and a roller for winding up the flexible substrate having the plurality of elements.

One aspect of the invention is a manufacturing apparatus of a semiconductor device, which includes a support means provided with a plurality of semiconductor integrated circuits; a plurality of holders for catching and holding the plurality of semiconductor integrated circuits; a first roller on which the plurality of holders are arranged in a row; a controller for controlling the pitch of the plurality of holders; a second roller for supplying a flexible substrate having a plurality of elements; a third roller for controlling the movement of the flexible substrate having the plurality of elements; and a fourth roller for winding up the flexible substrate having the plurality of elements. The first roller picks up the plurality of semiconductor integrated circuits provided over the support means by using the plurality of holders, and then the plurality of semiconductor integrated circuits are mounted on the plurality of respective elements by using the second roller.

One aspect of the invention is a manufacturing apparatus of a semiconductor device, which includes a support means provided with a plurality of semiconductor integrated circuits; a plurality of holders for catching and holding the plurality of semiconductor integrated circuits; a first roller on which the plurality of holders are arranged in a row; a controller for controlling the pitch of the plurality of holders; a second roller for supplying a flexible substrate having a plurality of elements; a third roller for controlling the movement of the flexible substrate having the plurality of elements; and a cutter for cutting the flexible substrate having the plurality of elements. The first roller picks up the plurality of semiconductor integrated circuits provided over the support means by using the plurality of holders, and then the plurality of semiconductor integrated circuits are mounted on the plurality of respective elements by using the second roller. Then, the cutter cuts the flexible substrate having the plurality of elements on which the plurality of semiconductor integrated circuits are mounted.

One aspect of the invention is a manufacturing apparatus of a semiconductor device, which includes a support means provided with a plurality of semiconductor integrated circuits; a plurality of holders for catching and holding the plurality of semiconductor integrated circuits; a first roller on which the plurality of holders are arranged in a row; a controller for controlling the pitch of the plurality of holders; a second roller for supplying a first flexible substrate having a plurality of elements; a third roller for controlling the movement of the first flexible substrate having the plurality of elements; a fourth roller for supplying a second flexible substrate; and a pair of a fifth roller and a sixth roller which attach the first flexible substrate having the plurality of elements, the plurality of semiconductor integrated circuits, and the second flexible substrate, to each other. The first roller picks up the plurality of semiconductor integrated circuits provided over the support means by using the plurality of holders, and then the plurality of semiconductor integrated circuits are mounted on the plurality of respective elements by using the second roller. Then, the pair of the fifth roller and the sixth roller attach the second flexible substrate to the first flexible substrate having the plurality of elements on which the plurality of semiconductor integrated circuits are mounted.

Note that the first roller, on which the plurality of holders are arranged in a row, has 2n sets of holders or (2n+1) sets of holders.

One aspect of the invention is a manufacturing apparatus of a semiconductor device, which includes a support means provided with a plurality of semiconductor integrated circuits; a plurality of first holders for catching and holding the plurality of semiconductor integrated circuits; a first roller on which the plurality of first holders are arranged in a row; a controller for controlling the pitch of the plurality of first holders; a plurality of second holders for catching and holding the plurality of semiconductor integrated circuits from the plurality of first holders; a second roller on which the plurality of second holders are arranged in a row; a third roller for supplying a flexible substrate having a plurality of elements; a fourth roller for controlling the movement of the flexible substrate having the plurality of elements; and a fifth roller for winding up the flexible substrate having the plurality of elements. The second roller catches and holds the plurality of semiconductor integrated circuits which have been caught and held by the plurality of first holders, by using the plurality of second holders, and then the plurality of semiconductor integrated circuits are mounted on the plurality of respective elements by using the fourth roller.

Note that each of the first roller and the second roller may have 2n sets of first holders and 2n sets of second holders. Alternatively, each of the first roller and the second roller may have (2n+1) sets of first holders and (2n+1) sets of second holders.

One aspect of the invention is a manufacturing method of a semiconductor device, which includes the steps of setting a plurality of semiconductor integrated circuits on a first support means; picking up the plurality of semiconductor integrated circuits by using a plurality of holders arranged in a row on a jig; controlling the pitch of the plurality of holders by a controller for controlling the pitch of the plurality of holders so that connection terminals of the plurality of semiconductor integrated circuits can be positioned opposite respective connection terminals of a plurality of elements over a substrate which is provided over a second support means; and connecting the connection terminals of the plurality of semiconductor integrated circuits to the respective connection terminals of the plurality of elements.

One aspect of the invention is a manufacturing method of a semiconductor device, which includes the steps of setting a plurality of semiconductor integrated circuits on a support means; picking up the plurality of semiconductor integrated circuits by using a plurality of holders arranged in a row on a roller; rotating a roller for supplying a flexible substrate having a plurality of elements, a roller for controlling the movement of the flexible substrate having the plurality of elements, and a roller for collecting the flexible substrate having the plurality of elements, thereby moving the flexible substrate having the plurality of elements; rotating the roller on which the plurality of holders are arranged in a row, so that the plurality of semiconductor integrated circuits can be positioned opposite the flexible substrate having the plurality of elements; controlling the pitch of the plurality of holders by a controller for controlling the pitch of the plurality of holders so that connection terminals of the plurality of semiconductor integrated circuits can be positioned opposite respective connection terminals of the plurality of elements over the flexible substrate; and connecting the connection terminals of the plurality of semiconductor integrated Circuits to the respective connection terminals of the plurality of elements by using the roller for controlling the movement of the flexible substrate having the plurality of elements and the roller on which the plurality of holders are arranged in a row.

Note that after connecting the connection terminals of the plurality of semiconductor integrated circuits to the respective connection terminals of the plurality of elements by using the roller for controlling the movement of the flexible substrate having the plurality of elements and the roller on which the plurality of holders are arranged in a row, the flexible substrate may be cut by a cutter.

Alternatively, after connecting the connection terminals of the plurality of semiconductor integrated circuits to the respective connection terminals of the plurality of elements by using the roller for controlling the movement of the flexible substrate having the plurality of elements and the roller on which the plurality of holders are arranged in a row, another flexible substrate may be attached to surfaces of the plurality of semiconductor integrated circuits and the plurality of elements by using a pair of rollers.

As a further alternative, after connecting the connection terminals of the plurality of semiconductor integrated circuits to the respective connection terminals of the plurality of elements by using the roller for controlling the movement of the flexible substrate having the plurality of elements and the roller on which the plurality of holders are arranged in a row, another flexible substrate may be attached to surfaces of the plurality of semiconductor integrated circuits and the plurality of elements by using a pair of rollers. Then, the flexible substrate having the plurality of elements and the other flexible substrate may be cut by a cutter.

By the manufacturing method of a semiconductor device of the invention, a semiconductor device can be manufactured through the steps of picking up a plurality of semiconductor integrated circuits by a plurality of holders; controlling the pitch of the plurality of holders so that connection terminals of the semiconductor integrated circuits can be positioned opposite respective connection terminals of elements; and connecting the semiconductor integrated circuits to the respective elements. Therefore, even when the pitch of the connection terminals of the adjacent semiconductor integrated circuits is different from the pitch of the connection terminals of the adjacent elements, it is possible to attach the semiconductor integrated circuits to the respective elements only by controlling the pitch of the plurality of holders while picking up the semiconductor integrated circuits from an element substrate and positioning them to be opposite the respective elements. Furthermore, by picking up a plurality of semiconductor integrated circuits and attaching them to a plurality of elements through a sequence of steps, a plurality of semiconductor devices can be manufactured. Therefore, a tact time can be reduced and mass productivity can be improved. Thus, a manufacturing method of a low-cost semiconductor device can be provided.

A manufacturing apparatus of a semiconductor device of the invention includes a jig which has a plurality of holders arranged in a row, a controller for controlling the pitch of the plurality of holders arranged in a row, a support means provided with a plurality of semiconductor integrated circuits, and a support means provided with a flexible substrate having a plurality of elements. The jig includes a plurality of holders arranged in a row and a controller for controlling the pitch of the holders. Therefore, even when the pitch of the connection terminals of the adjacent semiconductor integrated circuits is different from the pitch of the connection terminals of the adjacent elements, the semiconductor integrated circuits can be attached to the elements only by controlling the pitch of the plurality of holders while picking up the semiconductor integrated circuits from an element substrate and positioning them to be opposite the respective elements. Furthermore, by picking up a plurality of semiconductor integrated circuits and attaching them to a plurality of elements through a sequence of steps, a plurality of semiconductor devices can be manufactured. Therefore, a tact time can be reduced and mass productivity can be improved. Thus, a manufacturing apparatus capable of manufacturing a semiconductor device at low cost can be provided.

BRIEF DESCRIPTION OF THE DRAWINGS

In the accompanying drawings:

FIGS. 2A to 2D are cross-sectional diagrams illustrating a manufacturing method of a semiconductor device of the invention;

FIGS. 4A to 4D are cross-sectional diagrams illustrating a manufacturing method of a semiconductor device of the invention;

FIGS. 8A and 8B are cross-sectional diagrams illustrating a manufacturing method of a semiconductor device of the invention;

FIGS. 11A to 11C are cross-sectional diagrams illustrating a manufacturing method of a semiconductor device of the invention;

FIGS. 12A and 12B are cross-sectional diagrams illustrating a manufacturing method of a semiconductor device of the invention;

DETAILED DESCRIPTION OF THE INVENTION

Figure 1A:
FIGS. 1A to 1D are cross-sectional diagrams illustrating a manufacturing method of a semiconductor device of the invention.

Embodiment modes and embodiments of the invention will be described in detail below with reference to the accompanying drawings. Note that the invention is not limited to the following description, and it is to be easily understood by those skilled in the art that various changes and modifications can be made without departing from the spirit and scope of the invention. Therefore, the invention should be construed without limitation to the description in the embodiment modes and embodiments described below. In the structure of the invention described below, like reference numerals are used to designate identical portions in different drawings.

Embodiment 1

An apparatus and a method for manufacturing a semiconductor device in this embodiment mode will be described, with reference to FIGS. 1A to 1D, 16A and 16B, 17A and 17B, and 18.

Figure 18:
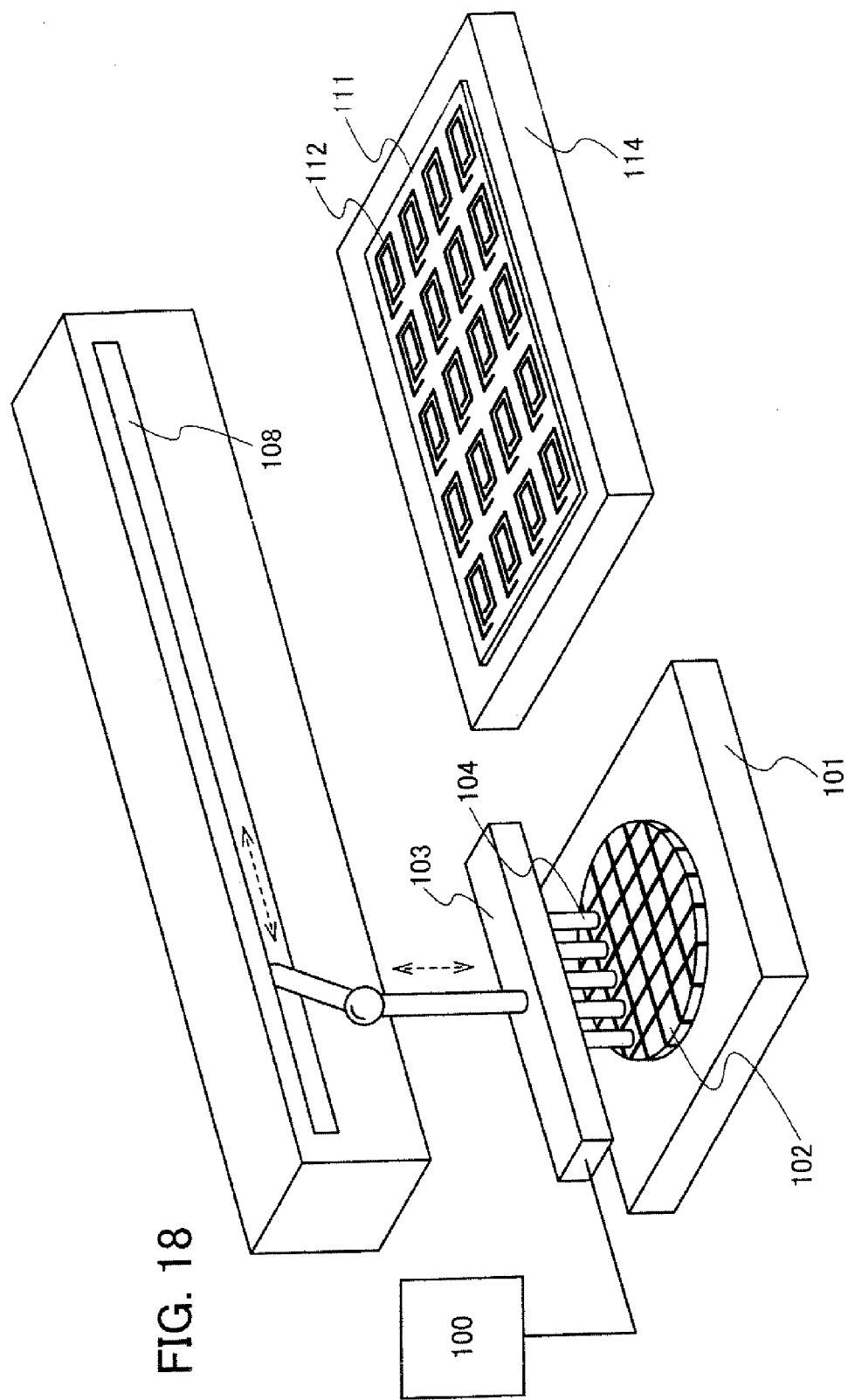
FIG. 18 is a perspective view illustrating a manufacturing apparatus of a semiconductor device of the invention.

A manufacturing apparatus of a semiconductor device in this embodiment mode includes, as shown in the example in FIG. 18, a plurality of holders 104 arranged in a row, which pick up semiconductor integrated circuits 102 from a support means 101, a jig 103 having the plurality of holders 104, a controller 100 for controlling the plurality of holders 104, and a support means 114 mounting a substrate 111 which has a plurality of elements. The semiconductor integrated circuits 102 which are picked up by the holders 104 arranged in a row are mounted on the respective elements formed over the substrate 111. Note that in the following embodiment modes, antennas 112 are illustrated as the elements, and a device in which a semiconductor integrated circuit is mounted on an antenna is illustrated as a semiconductor device. However, the element is not limited to the antenna. In addition, the semiconductor device means a device in which a semiconductor integrated circuit is mounted on an element.

As the holders 104 arranged in a row, holding tools typified by absorbing nozzles, collets, tweezers, or pincers can be used. Here, absorbing nozzles are used as holding jigs. In addition, the holders 104 may be provided with heaters. By providing the holders 104 with heaters, it becomes possible, after the semiconductor integrated circuits 102 provided over the support means 101 are picked up by the holders 104 and moved to the substrate 111 having the antennas 112, to mount the semiconductor integrated circuits 102 on the respective antennas 112 by thermocompression bonding by heating the heaters provided for the holders. Note that the heaters are preferably capable of heating at temperatures in the range from a room temperature to 500° C. In the case of connecting the semiconductor integrated circuits to the antennas by pressure bonding with the holders 104, it is preferable that each holder can withstand a load of 10 g to 100 kg, or preferably 50 g to 50 kg. Furthermore, by providing the holders 104 with drivers such as motors, the direction (θ direction) of the semiconductor integrated circuits can be rotated, which can facilitate an alignment process for mounting the semiconductor integrated circuits on the substrates having the antennas.

The jig 103 is a moving device such as a robot aim, a head, or a roller, which can freely move up and down and horizontally (in x-y-z directions). The jig 103 may be connected to a driver 108 such as a rail or a motor. After the semiconductor integrated circuits 102 over the support means 101 are picked up by the holders 104 using the jig 103 or the driver 108, the semiconductor integrated circuits 102 are moved to the vicinity of the antennas 112 over the support means 114, thereby the semiconductor integrated circuits 102 can be mounted on the respective antennas 112.

The controller 100 for controlling the holders 104 arranged in a row is a means for, after the semiconductor integrated circuits 102 are picked up from the support means 101, moving the holders 104 arranged in a row so that connection terminals of the semiconductor integrated circuits 102 can be positioned opposite respective connection terminals of the antennas 112 formed over the substrate 111. The controller 100 includes a detection element which detects that the semiconductor integrated circuits 102 are picked up by the holders 104 arranged in a row, a detector which detects that the holders 104 arranged in a row are moved to a position opposite the antennas, and a driver for changing the pitch of the holders 104 arranged in a row. Further, the controller 100 may include a detection element for detecting the pitch of the connection terminals of the adjacent antennas. As the detection element which detects that the semiconductor integrated circuits 102 are picked up by holders 104 arranged in a row, or the detection element for detecting the pitch of the connection terminals of the adjacent antennas, a CCD camera or the like can be employed. By processing image data which is detected by the detection element, the positions of the connection terminals of the semiconductor integrated circuits and the antennas, and alignment thereof are detected.

Figure 16A:
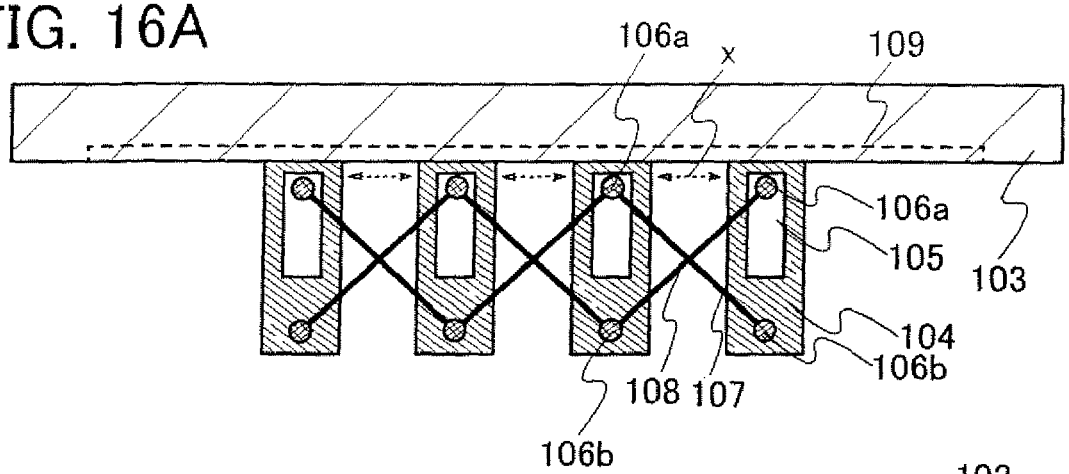
FIGS. 16A and 16B are cross-sectional diagrams which partially illustrate a controller of a manufacturing apparatus of a semiconductor device of the invention.

Typical examples of the driver which is included in the controller 100 for controlling the holders 104 arranged in a row is described, with reference to FIGS. 16A and 16B, and 17A and 17B. As shown in FIG. 16A, each of the holders 104 arranged in a row includes a rail 105, a support 106a which moves within the rail 105, a support 106b which is fixed to the holder 104, and axes 107 and 108 which are provided between the adjacent supports 106a and 106b. In addition, a rail 109 is provided in the jig 103 to allow the movement of the holders 104.

In the case of picking up the semiconductor integrated circuits over the support means, as shown in FIG. 16A, the support 106a which moves within the rail 105 is positioned away from the support 106b which is fixed. The pitch of the adjacent holders 104 at this time is represented by x.

Figure 16B:
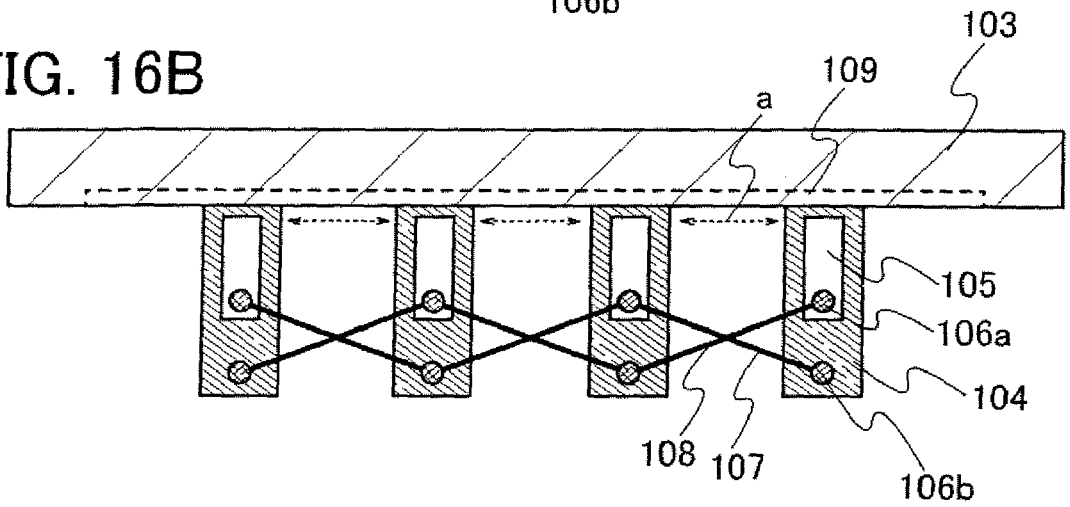

In the case of positioning the semiconductor integrated circuits to be opposite the respective antennas, as shown in FIG. 16B, the support 106a moves within the rail 105, so that the distance between the support 106a and the support 106b which is fixed becomes shorter. At this time, the axes 107 and 108 move in conjunction so that the pitch of the adjacent holders 104 can be widened from x to a.

Figure 17A:
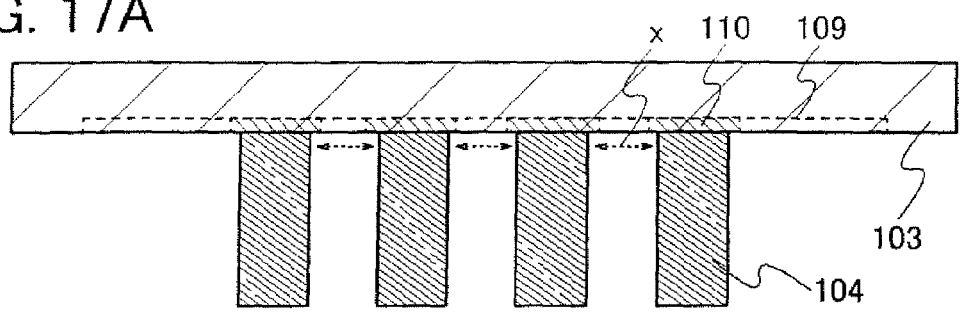
FIGS. 17A and 17B are cross-sectional diagrams which partially illustrate a controller of a manufacturing apparatus of a semiconductor device of the invention.

As another example, as shown in FIG. 17A, the rail 109 is provided within the jig 103, and each holder 104 is provided with a power system 110 such as a motor which travels within the rail 109.

In the case of picking up the semiconductor integrated circuits over the support means, the pitch of the holders 104 is x as shown in FIG. 17A.

Figure 17B:
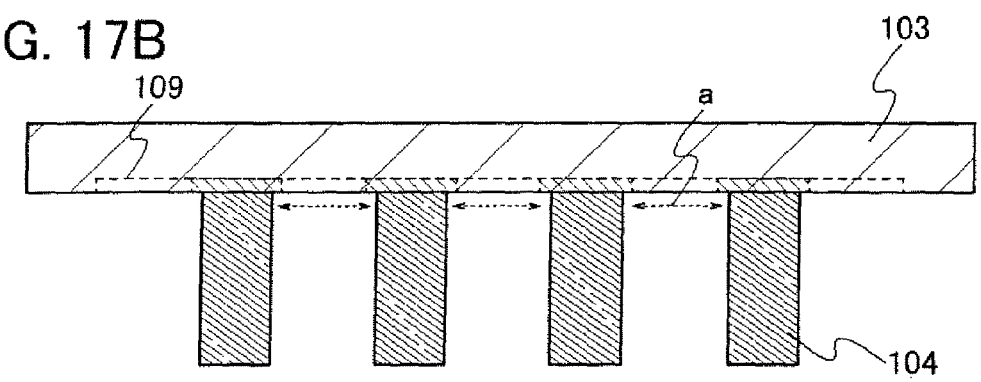

In the case of positioning the semiconductor integrated circuits to be opposite the respective antennas, as shown in FIG. 17B, the power system provided for each holder 104 travels within the rail 109, so that the pitch of the holders 104 can be widened from x to a.

The support means 101 is a means for supporting a plurality of semiconductor integrated circuits, and the support means 114 is a means for supporting a flexible substrate having a plurality of antennas, each of which may typically be a stage, a belt conveyor, a robot arm, or the like. In addition, the stage may be provided on a moving apparatus which can move up and down (in z direction) and horizontally (in x-y directions). In the case of using a stage or a belt conveyor as the support means, the plurality of semiconductor integrated circuits are set on a sheet or a substrate. Meanwhile, in the case of using a robot arm as the support means, the plurality of semiconductor integrated circuits may be set on an adhesive film which is fixed on a frame. In that case, the robot arm supports the frame. Examples of the adhesive film include a UV curing adhesive film (also called a UV film, a UV tape, or a UV sheet), a pressure-sensitive film whose adhesion changes with pressure applied (also called a pressure-sensitive tape or a pressure-sensitive sheet), a thermal curing adhesive film (also called a thermal curing adhesive tape or a thermal curing adhesive sheet), and the like. Further, the adhesive film may be an expand-type film which is elastic.

The semiconductor integrated circuit 102 is a circuit including a plurality of semiconductor elements. As typical examples of the semiconductor integrated circuit, a silicon chip on which a plurality of semiconductor elements are formed, a chip including thin film semiconductor elements, and the like can be given.

As a typical example of a manufacturing method of a silicon chip on which a plurality of semiconductor elements are formed, the following steps are performed: forming a MOS transistor, a capacitor, a resistor, a diode, and the like on the surface of a silicon wafer, conducting polishing treatment called a back-grind process to the rear surface of the silicon wafer so that the silicon wafer has a thickness of 30 to 250 μm, or preferably 50 to 100 μm, and cutting the silicon wafer into rectangular chips with a dicer.

As a typical example of a chip including thin film semiconductor elements, a layer including a thin film transistor, a capacitor, a resistor, a thin film diode, and the like can be given. As a typical example of a manufacturing method of a chip having thin film semiconductor elements, the following steps are performed: forming a layer including a thin film transistor, a capacitor, a resistor, a thin film diode, and the like over a substrate; peeling the layer off the substrate, and cutting the layer into rectangular chips.

The antenna 112 can be formed using a conductive layer which is formed over a flexible substrate, by using a printing method, a method of etching a conductive thin film, a plating method, or the like. The antenna 112 can be formed with a conductive layer containing one or more elements of Ag, Au, Cu, Ni, Pt, Pd, Ir, Rh, W, Al, Ta, Mo, Cd, Zn, Fe, Ti, Zr, and Ba.

Figure 13A:
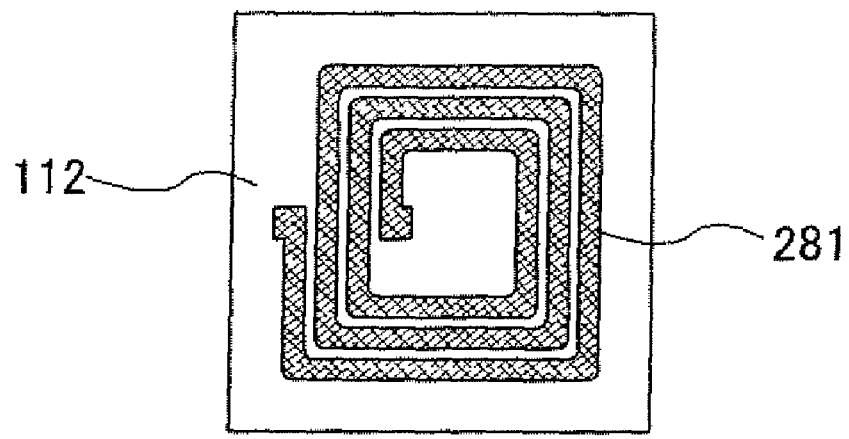
FIGS. 13A to 13C are top views illustrating shapes of an antenna which are applicable to the invention.
Figure 13B:
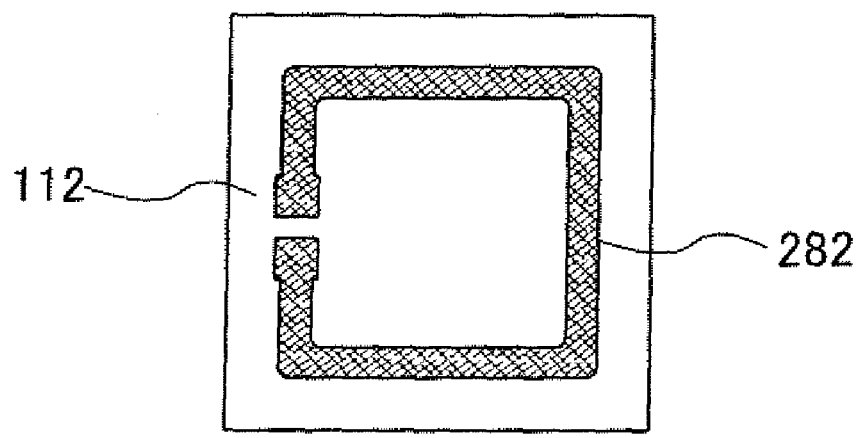
Figure 13C:

FIGS. 13A to 13C are top views of antennas which are applicable to the invention. When adopting an electromagnetic coupling method or an electromagnetic induction method (e.g., 13.56 MHz) as the signal transmission method of the semiconductor device, the shape of a conductive layer functioning as an antenna can be a rectangular coil shape 281 as shown in FIG. 13A or a circular coil shape (e.g., a spiral antenna), in order to utilize electromagnetic induction which occurs due to a change in magnetic flux density. Alternatively, a rectangular loop shape 282 as shown in FIG. 13B or a circular loop shape can be employed.

When adopting a microwave method (e.g., UHF bands (860 to 960 MHz) or 2.45 GHz), the shape (e.g., length) of a conductive layer functioning as an antenna may be appropriately set in consideration of the wavelength of an electromagnetic wave used for signal transmission, and a linear dipole shape 283 as shown in FIG. 13C, a curved dipole shape, or a plane shape (e.g., a patch antenna) can be used.

In this embodiment mode, although the antenna 112 is illustrated as a typical example of the element, the invention is not limited to this. For example, a semiconductor integrated circuit, a sensor, a battery, a wiring board, a display device, or the like can be used as appropriate.

The substrate 111 can be formed by stacking a substrate made of PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like, and an adhesive organic resin (e.g., acrylic resin, epoxy resin, or silicone resin) as a layer made of a thermoplastic material. Alternatively, the substrate 111 can be formed by stacking paper made of a fibrous material and the above adhesive organic resin. In addition, the substrate may be a flexible substrate. Furthermore, a glass substrate, a quartz substrate, a metal substrate, or the like can be employed.

A manufacturing method of a semiconductor device shown in this embodiment mode is described below.

As shown in FIG. 1A, the plurality of semiconductor integrated circuits 102 which are provided over the support means 101 are caught and held by the plurality of holders 104 arranged in a row. The pitch of the holders 104 at this time is represented by x ($0 \leqq x$).

Figure 1B:

Next, as shown in FIG. 1B, the semiconductor integrated circuits 102 are picked up from the support means 101. At this time, the jig 103 is moved in a direction away from the support means 101. Alternatively, the support means 101 is moved in a direction away from the jig 103. As a further alternative, both the jig 103 and the support means 101 are moved in directions in which the holders 104 and the support means 101 are positioned away from each other. In the case of providing a means for controlling the telescopic movement of the holders 104, the holders 104 are shrunk. Accordingly, the semiconductor integrated circuits 102 can be picked up from the support means 101.

Figure 1C:
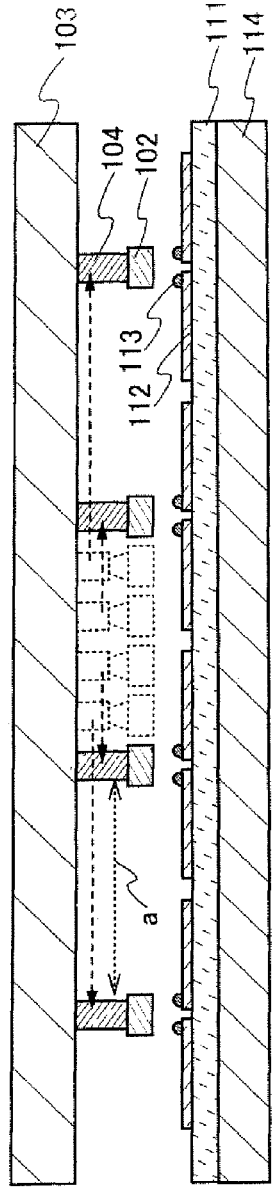

Next, as shown in FIG. 1C, the substrate 111 having the antennas 112 are mounted on the support means 114. Next, conductive pastes 113 are applied to connection terminals (not shown) of the antennas 112. Note that instead of the conductive pastes 113, anisotropic conductive agents or anisotropic conductive films may be provided on the connection terminals of the antennas 112. In addition, parts of the antennas 112 may be used as the connection terminals of the antennas 112.

Next, the jig 103 is moved to be positioned above the substrate 111 having the antennas 112. At this time, the pitch of the holders 104 is widened by the controller so that the connection terminals of the semiconductor integrated circuits 102 can be positioned opposite the respective connection terminals of the antennas 112. Typically, when the pitch of the connection terminals of the adjacent antennas 112 is a, the pitch of the holders 104 arranged in a row is also set to be a by the controller. Note that instead of moving the jig 103 to be positioned above the substrate 111 having the antennas 112, it is also possible to move the support means 114 which supports the substrate 111 having the antennas 112 to be positioned below the jig 103.

Figure 1D:
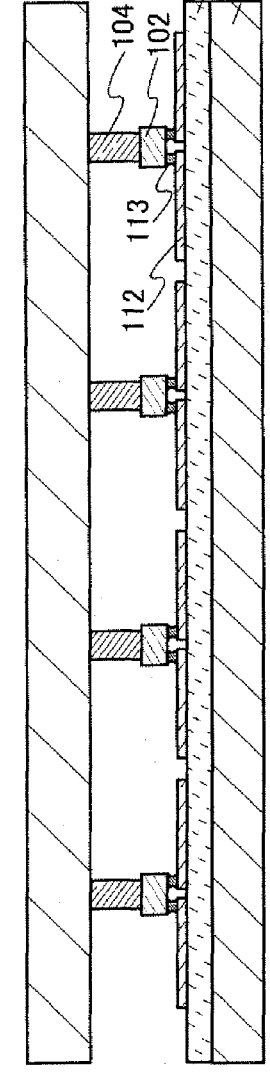

Next, as shown in FIG. 1D, the semiconductor integrated circuits 102 are mounted on the conductive pastes 113. After that, the semiconductor integrated circuits 102 are connected to the respective antennas 112 with the conductive pastes 113 therebetween though a reflow process or the like.

Alternatively, bonding means may be provided. In that case, after mounting (temporally attaching) the semiconductor integrated circuits 102 which have been picked up by the jig 103 having the holders 104 onto the respective antennas 112, the semiconductor integrated circuits 102 and the conductive pastes 113 can be attached to each other by pressure bonding, so that the semiconductor integrated circuits 102 can be mounted (attached) onto the respective antennas 112. As examples of such bonding means, there are means using a thermocompression bonding method, an ultrasonic bonding method, or the like. Typically, a jig having a heater or an ultrasonic horn can be used.

Through the above steps, a substrate having a plurality of semiconductor devices each of which includes a semiconductor integrated circuit and an antenna can be manufactured. After that, a protective layer may be formed so as to cover the semiconductor integrated circuits and the antennas. Alternatively, another substrate may be attached to the substrate 111 so as to cover the semiconductor integrated circuits and the antennas. As such a substrate, a flexible substrate which has been described for the substrate 111 can be used as appropriate.

Furthermore, by cutting the flexible substrate, semiconductor devices each of which includes a semiconductor integrated circuit and an antenna can be manufactured.

By the manufacturing method of a semiconductor device in this embodiment mode, a semiconductor device can be manufactured through the steps of picking up semiconductor integrated circuits by holders, controlling the pitch of the holders so that connection terminals of the semiconductor integrated circuits can be positioned opposite respective connection terminals of antennas; and connecting the semiconductor integrated circuits to the respective antennas. Therefore, even when the pitch of the connection terminals of the adjacent semiconductor integrated circuits is different from the pitch of the connection terminals of the adjacent antennas, it is possible to attach the semiconductor integrated circuits to the respective antennas only by controlling the pitch of the holders while picking up the semiconductor integrated circuits and positioning them to be opposite the respective antennas. Furthermore, by picking up a plurality of semiconductor integrated circuits and attaching them to a plurality of antennas through a sequence of steps, a plurality of semiconductor devices can be manufactured. Therefore, a tact time can be reduced and mass productivity can be improved. Thus, a manufacturing method of a low-cost semiconductor device can be provided.

The manufacturing apparatus of a semiconductor device in this embodiment mode includes a jig which has a plurality of holders arranged in a row, a controller for controlling the pitch of the holders arranged in a row, a support means provided with a plurality of semiconductor integrated circuits, and a support means provided with a flexible substrate having a plurality of antennas. The jig includes a plurality of holders arranged in a row and a controller for controlling the pitch of the holders arranged in a row. Therefore, even when the pitch of the connection terminals of the adjacent semiconductor integrated circuits is different from the pitch of the connection terminals of the adjacent antennas, it is possible to attach the semiconductor integrated circuits to the respective antennas only by controlling the pitch of the holders while picking up the semiconductor integrated circuits and positioning them to be opposite the respective antennas. Furthermore, by picking up a plurality of semiconductor integrated circuits and attaching them to a plurality of antennas through a sequence of steps, a plurality of semiconductor devices can be manufactured. Therefore, a tact time can be reduced and mass productivity can be improved. Thus, a manufacturing apparatus capable of manufacturing a semiconductor device at low cost can be provided.

Embodiment Mode 2

In this embodiment mode, an apparatus and a method for manufacturing a semiconductor device which employs a roll-to-roll system is described, with reference to FIGS. 2A to 2D, 3A to 3D, 4A to 4D and 19.

Figure 19:
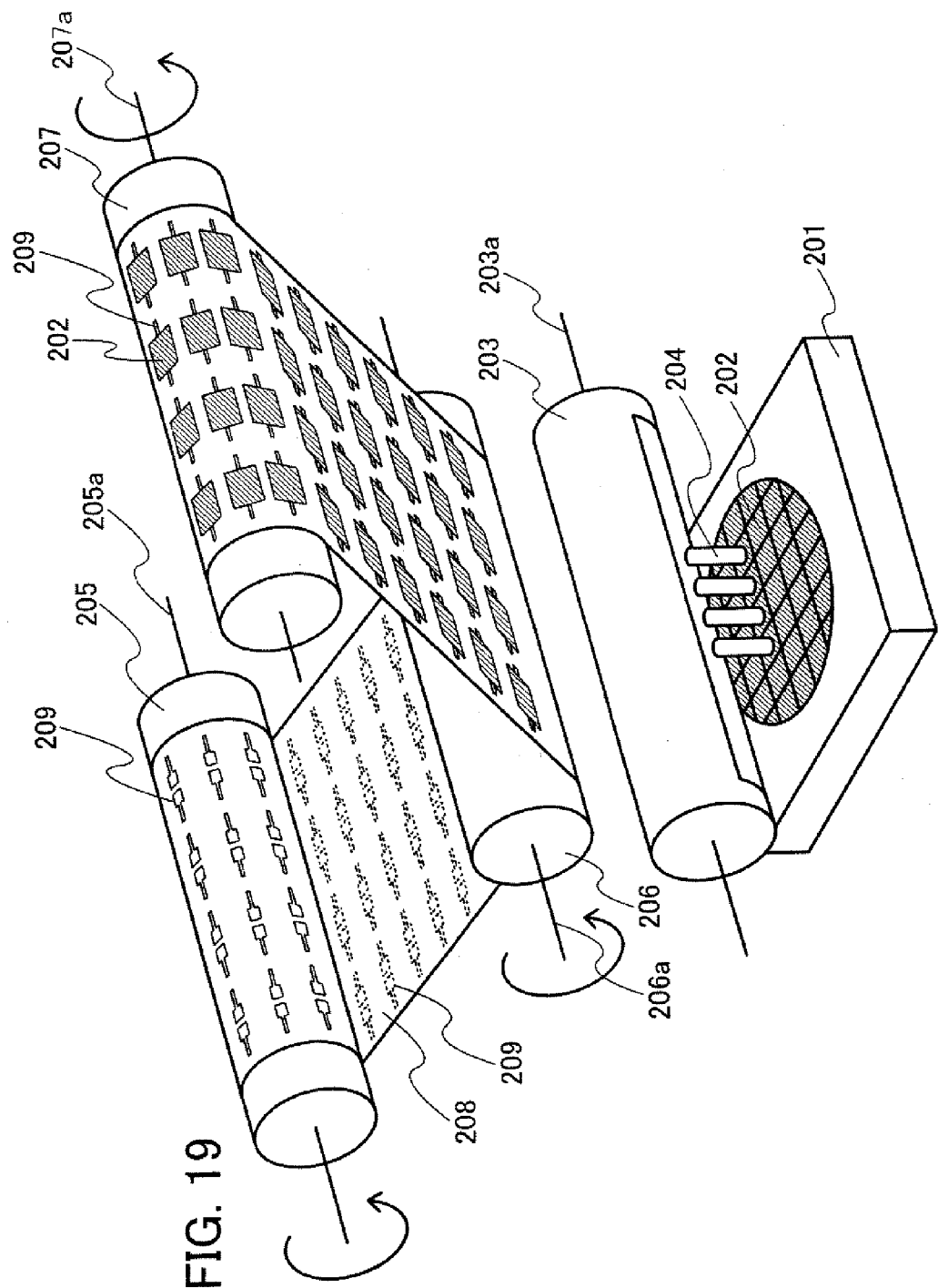
FIG. 19 is a perspective view illustrating a manufacturing apparatus of a semiconductor device of the invention.

As shown in FIG. 19, a manufacturing apparatus of a semiconductor device in this embodiment mode includes a supply roller 205 around which a flexible substrate 208 having antennas 209 is wound, a roller 206 which controls the movement of the flexible substrate 208 and mounts semiconductor integrated circuits 202 on the respective antennas 209, and a collecting roller 207 for winding up the flexible substrate 208 having the antennas 209 on which the semiconductor integrated circuits 202 are mounted. The manufacturing apparatus also includes a support means 201 for supporting the semiconductor integrated circuits 202 and a roller 203 having holders 204 for catching and holding the semiconductor integrated circuits 202. Note that the holders 204 are arranged in a row on the side surface of the roller 203. In addition, the surface of the flexible substrate 208 having the antennas 209 may be provided with an anisotropic conductive film. The rollers 203, 205, 206, and 207 may be provided with moving means for moving their respective rotation axes 203a, 205a, 206a, and 207a. By the moving means for moving the rotation axes 203a, 205a, 206a, and 207a, the rollers 203, 205, 206, and 207 can be moved up and down, and thus the positions of the rollers 203, 205, 206, and 207 can be controlled. Furthermore, the holders 204 may be provided with means for controlling the telescopic movement of the holders 204.

For the semiconductor integrated circuits 202, the holders 204, the antennas 209, and the flexible substrate 208 having the antennas 209 in this embodiment anode, the semiconductor integrated circuits 102, the holders 104, the antennas 112, and the substrate 111 having the antennas 112 shown in Embodiment Mode 1 can be used as appropriate.

The roller 206, which controls the movement of the flexible substrate 208 and mounts the semiconductor integrated circuits 202 on the respective antennas 209, is provided between the supply roller 205 and the collecting roller 207. In addition, the roller 206, which controls the movement of the flexible substrate 208 and mounts the semiconductor integrated circuits 202 on the respective antennas 209, is provided in a position opposite the roller 203 having the holders 204, with the flexible substrate 208 having the antennas 209 therebetween.

Each of the rollers 203, 205, 206, and 207 is a cylindrical rotating body, which typically corresponds to a cylindrical cast having a polished surface, or the like. Each of the rollers 203, 205, 206, and 207 rotates at a predetermined speed. The rollers 205, 206, and 207 rotate in the same direction, while the roller 203 rotates in the opposite direction to or the same direction as the roller 206.

Now, the structure of the holders 204 which are arranged in a row on the roller 203 is described. FIG. 2A shows a cross section of a manufacturing apparatus of a semiconductor device in the x-axis direction, and FIG. 2B shows a cross section of the manufacturing apparatus of a semiconductor device in FIG. 2A in the y-axis direction. FIG. 2C shows a cross section of the manufacturing apparatus of a semiconductor device in the x-axis direction, and FIG. 2D shows a cross section of the manufacturing apparatus of a semiconductor device in FIG. 2C in the y-axis direction. In FIGS. 2A and 2B, the plurality of holders 204 are arranged in a row in the y-axis direction of the roller 203. The pitch of the holders 204 arranged in a row at this time is x. Note that although FIGS. 2A to 2D show the structures where the plurality of holders 204 are arranged in a row in the y-direction, the invention is not limited to this. That is, the plurality of holders 204 may be arranged in a row in the x-axis direction.

Next, a manufacturing method of a semiconductor device is described.

As shown in FIGS. 2A and 2B, when the roller 205 rotates, the flexible substrate 208 having the antennas 209 is transferred. The flexible substrate 208 is delivered to the roller 207 through the roller 206. In addition, by rotation of the rollers 205 to 207, the flexible substrate 208 is wound up around the roller 207. That is, the flexible substrate 208 is collected by the roller 207.

The roller 203 rotates in the opposite direction to or the same direction as the moving direction of the support means 201. By appropriately controlling the pressure of the roller 203, the distance between the holders 204 and the semiconductor integrated circuits 202, the rotation speed of the roller 203, and the moving speed of the support means 201, the semiconductor integrated circuits 202 provided over the support means 201 can be caught and held by the holders 204 on the roller 203.

Next, by rotating the roller 203 in the opposite direction to or the same direction as the roller 206, the semiconductor integrated circuits 202 are peeled off the support means 201.

Alternatively, the following method can be used instead of the above method to pick up the semiconductor integrated circuits 202 from the support means 201. Under the condition that the roller 203 does not rotate, the roller 203 is moved to the side of the semiconductor integrated circuits 202 by a moving means for moving the rotation axis of the roller 203. Next, after catching and holding the semiconductor integrated circuits 202 from the support means 201 by using the holders 204, the roller 203 is moved to the roller 206 side by the moving means for moving the rotation axis of the roller 203. Accordingly, the semiconductor integrated circuits 202 are picked up from the support means 201 by the holders 204. After that, the roller 203 is rotated. By such moving of the roller 203, the semiconductor integrated circuits 202 can be surely peeled off the support means 201.

As a further alternative, the following method can be used instead of the above methods to pick up the semiconductor integrated circuits 202 from the support means 201. Under the condition that the roller 203 does not rotate, the holders 204 are stretched to the side of the semiconductor integrated circuits 202 by a means for controlling the telescopic movement of the holders 204. Next, after catching and holding the semiconductor integrated circuits 202 from the support means 201 by using the holders 204, the holders 204 are shrunk by the means for controlling the telescopic movement of the holders 204. Accordingly, the semiconductor integrated circuits 202 are picked up from the support means 201 by the holders 204. After that, the roller 203 is rotated. By such telescopic movement of the holders 204, the semiconductor integrated circuits 202 can be surely peeled off the support means 201.

Next, as shown in FIGS. 2C and 2D, while rotating the roller 203, the pitch of the holders 204 is widened by a controller so that connection terminals of the semiconductor integrated circuits 202 can be positioned opposite respective connection terminals of the antennas 209. The pitch of the holders 204 arranged in a row at this time is represented by a.

Next, while bolding the flexible substrate 208, the antennas 209, the anisotropic conductive film 210, and the semiconductor integrated circuits 202 between the roller 206 and the holders 204, one or both of pressure treatment and thermal treatment is/are performed, thereby the semiconductor integrated circuits 202 are mounted on the respective antennas 209 formed over the flexible substrate 208. By appropriately controlling the distance between the roller 206 and the holders 204 and the rotation speed of a pair of the rollers 203 and 206, the semiconductor integrated circuits 202 can be mounted on the respective antennas 209 over the flexible substrate 208.

As a further alternative, the following method can be used instead of the above methods to mount the semiconductor integrated circuits 202 on the respective antennas 209 over the flexible substrate 208. When the semiconductor integrated circuits 202 have moved to a position opposite the antennas 209 by rotating the roller 203, the rotation of the rollers 203, 205, 206, and 207 is stopped. Next, the pitch of the holders 204 is widened by a controller so that connection terminals of the semiconductor integrated circuits 202 can be positioned opposite respective connection terminals of the antennas 209. The pitch of the holders 204 arranged in a row at this time is represented by a. Next, the roller 203 is moved to the roller 206 side by a moving means for moving the rotation axis of the roller 203. Next, while holding the flexible substrate 208, the antennas 209, the anisotropic conductive film 210, and the semiconductor integrated circuits 202 between the roller 206 and the holders 204, one or both of pressure treatment and thermal treatment is/are performed, thereby the semiconductor integrated circuits 202 are mounted on the respective antennas 209 formed over the flexible substrate 208.

Next, by moving the roller 203 to the support means 201 side by the moving means for moving the rotation axis of the roller 203, the semiconductor integrated circuits 202 can be mounted on the respective antennas 209 over the flexible substrate 208. After that, the rollers 203, 205, 206, and 207 are rotated.

As a further alternative, the following method can be used instead of the above methods to mount the semiconductor integrated circuits 202 on the respective antennas 209 over the flexible substrate 208. When the semiconductor integrated circuits 202 have moved to a position opposite the antennas 209 by rotating the roller 203, the rotation of the rollers 203, 205, 206, and 207 is stopped. Next, the pitch of the holders 204 is widened by a controller so that connection terminals of the semiconductor integrated circuits 202 can be positioned opposite respective connection terminals of the antennas 209. The pitch of the holders 204 arranged in a row at this time is represented by a. Next, under the condition that the rollers 203, 205, 206, and 207 do not rotate, the rollers 205 to 207 are moved to the holders 204 side by moving means for moving the rotation axes of the rollers 205 to 207. Next, while holding the flexible substrate 208, the antennas 209, the anisotropic conductive film 210, and the semiconductor integrated circuits 202 between the holders 204 and the roller 206, one or both of pressure treatment and thermal treatment is/are performed, thereby the semiconductor integrated circuits 202 are mounted on the respective antennas 209 formed over the flexible substrate 208.

Next, after moving the roller 206 away from the support means 201 by the moving means for moving the rotation axes of the rollers 205 to 207, the rollers 203, 205, 206, and 207 are rotated.

As a further alternative, the following method can be used instead of the above methods to mount the semiconductor integrated circuits 202 on the respective antennas 209 over the flexible substrate 208. When the semiconductor integrated circuits 202 have moved to a position opposite the antennas 209 by rotating the roller 203, the rotation of the rollers 203, 205, 206, and 207 is stopped. Next, the pitch of the holders 204 is widened by a controller so that connection terminals of the semiconductor integrated circuits 202 can be positioned opposite respective connection terminals of the antennas 209. The pitch of the holders 204 arranged in a row at this time is represented by a. Next, under the condition that the rollers 203, 205, 206, and 207 do not rotate, the holders 204 are stretched to the roller 206 side by a means for controlling the telescopic movement of the holders 204. Next, while holding the flexible substrate 208, the antennas 209, the anisotropic conductive film 210, and the semiconductor integrated circuits 202 between the holders 204 and the roller 206, one or both of pressure treatment and thermal treatment is/are performed, thereby the semiconductor integrated circuits 202 are mounted on the respective antennas 209 formed over the flexible substrate 208. Next, after shrinking the holders 204 by the means for controlling the telescopic movement of the holders 204, the rollers 203, 205, 206, and 207 are rotated.

Note that the manufacturing apparatus of a semiconductor device in this embodiment mode may also be provided with a pair of rollers having a heating means such as a heater, in addition to the roller 203 having the holders 204. In that case, after mounting (temporally attaching) the semiconductor integrated circuits 202 which have been picked up by the roller 203 having the holders 204 onto the respective antennas 209, the semiconductor integrated circuits 202 and the anisotropic conductive film 210 may be attached to each other by thermocompression bonding using the pair of rollers having a heating means such as a heater, so that the semiconductor integrated circuits 202 can be mounted (attached) onto the respective antennas 209.

Note that in FIGS. 2A to 2D, the connection terminal of each antenna is disposed in a direction parallel to the rotation direction of the roller 206 (i.e., in the x-axis direction). However, the invention is not limited to this, and the connection terminal of each antenna may be disposed in a direction perpendicular to the rotation direction of the roller 206 (i.e., in the y-axis direction). In that case, similarly to the structures shown in FIGS. 2A to 2D, the semiconductor integrated circuits can be mounted on the respective antennas only by once holding the antennas and the semiconductor integrated circuits between the roller 206 and the holders 204, which can improve the yield.

After that, the flexible substrate 208 having the antennas 209 and the semiconductor integrated circuits 202 connected to the respective antennas 209 are collected by the roller 207. Through the above steps, a sheet having a plurality of semiconductor devices where semiconductor integrated circuits are mounted on antennas can be fanned.

Figure 3A:
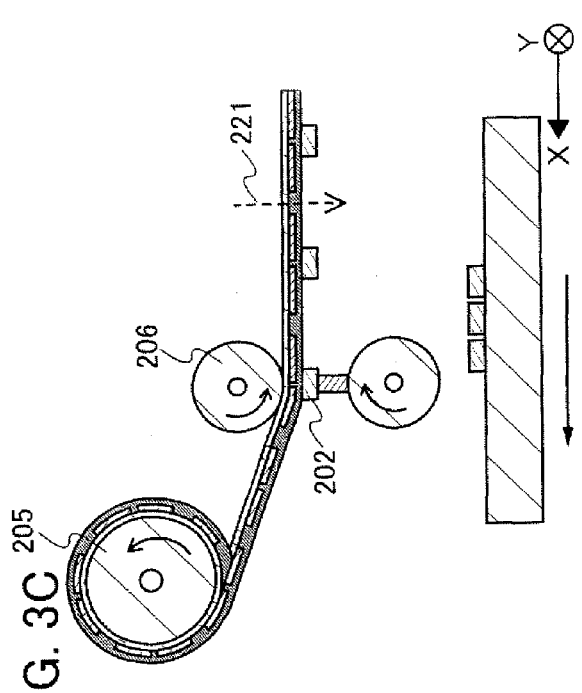
FIGS. 3A to 3D are cross-sectional diagrams illustrating a manufacturing method of a semiconductor device of the invention.
Figure 3B:
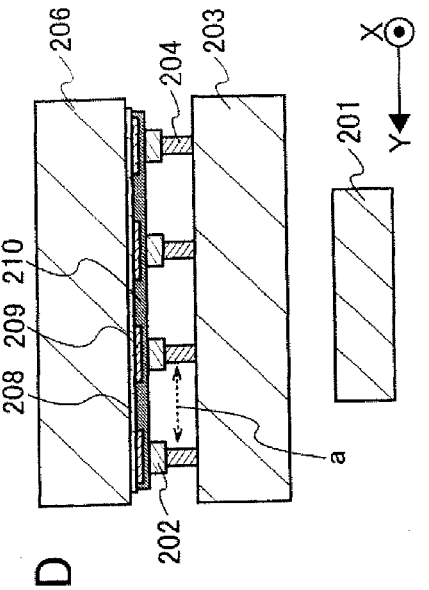
Figure 3C:
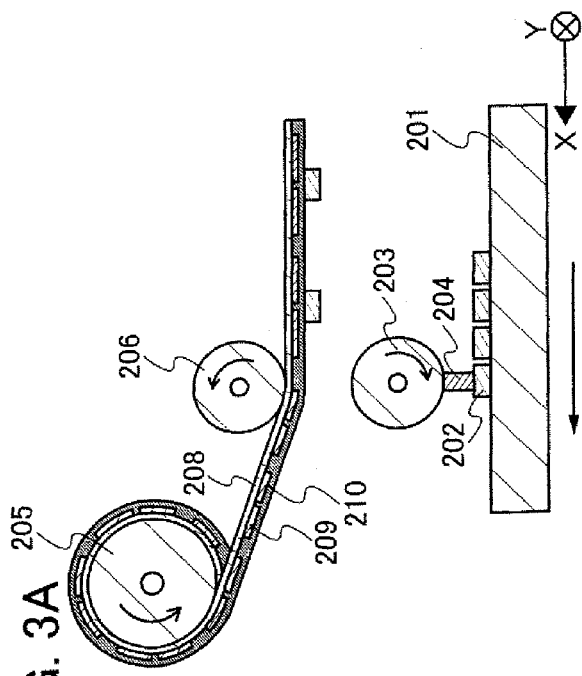
Figure 3D:
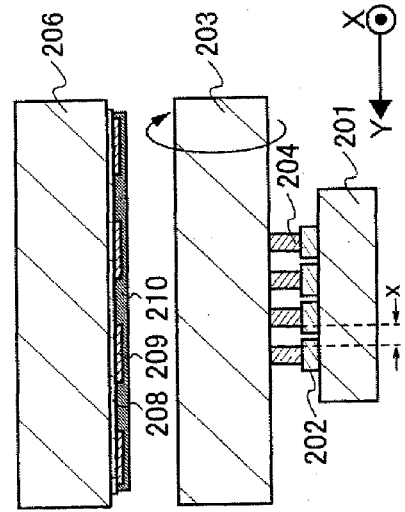

Furthermore, a cutter 221 may be provided as shown in FIG. 3C, instead of the collecting roller 207 which winds up the flexible substrate 208 having the attached antennas 209 and the semiconductor integrated circuits 202 mounted on the respective antennas 209. As a result, semiconductor devices each of which includes the flexible substrate 208 having the antenna 209 and the semiconductor integrated circuit 202 connected thereto can be cut into individual chips. As the cutter 221, a dicing machine, a scribing machine, a laser irradiation apparatus, and the like can be used as appropriate.

In addition, the sheet having the semiconductor devices shown in FIGS. 2A to 2D and 3A to 3D can be sealed by using a flexible substrate. Here, modified examples of FIGS. 3A to 3D are described with reference to FIGS. 4A and 4D. FIGS. 4A and 4C show cross sections of the manufacturing apparatus of a semiconductor device in the x-axis direction, and FIGS. 4B and 4D show cross sections of the manufacturing apparatus of a semiconductor device in FIGS. 4A and 4C respectively, in the y-axis direction.

As shown in FIGS. 4A and 4C, in addition to the manufacturing apparatus of a semiconductor device shown in FIGS. 3A to 3D, a supply roller 231 around which a flexible substrate 232 is wound, and a pair of rollers 233 and 234 which control the movement of the flexible substrate 232 and attaches the flexible substrate 232 to the flexible substrate 208 having the semiconductor integrated circuits 202 and the antennas 209 may be provided.

Similarly to FIGS. 2A to 2D and 3A to 3D, the semiconductor integrated circuits 202 provided over the support means 201 can be caught and held by the holders 204 which are arranged in a row on the roller 203, by appropriately controlling the pressure of the roller 203, the distance between the holders 204 and the semiconductor integrated circuits 202, the rotation speed of the roller 203, and the moving speed of the support means 201. The pitch of the holders 204 arranged in a row at this time is represented by x.

Next, by rotating the roller 203 in the opposite direction to or the same direction as the roller 206, the semiconductor integrated circuits 202 are peeled off the support means 201. Next, as shown in FIGS. 4C and 4D, the pitch of the holders 204 is widened by a controller so that the connection terminals of the semiconductor integrated circuits 202 and the antennas 209 can be positioned opposite each other. Here, the pitch of the holders 204 arranged in a row is widened from x to a.

Next, while holding the flexible substrate 208, the antennas 209, the anisotropic conductive film 210, and the semiconductor integrated circuits 202 between the roller 206 and the holders 204, one or both of pressure treatment and thermal treatment is/are performed, thereby the semiconductor integrated circuits 202 are mounted on the respective antennas 209 formed over the flexible substrate 208. By appropriately controlling the distance between the roller 206 and the holders 204 and the rotation speed of the roller 206 and the roller 203, the semiconductor integrated circuits 202 can be mounted on the respective antennas 209 formed over the flexible substrate 208.

By rotating the roller 231, the flexible substrate 232 is transferred. The flexible substrate 232 is delivered to the roller 233. By rotating the pair of the rollers 233 and 234 in opposite directions or in the same direction, the flexible substrate 208 having the semiconductor integrated circuits 202 and the antennas 209 is sealed with the flexible substrate 232. By appropriately controlling the distance between the rollers 233 and 234 and the rotation speed of the pair of the rollers 233 and 234, the semiconductor integrated circuits 202 and the antennas 209 can be sealed with the flexible substrates 208 and 232.

Through the above steps, a sheet having semiconductor devices can be manufactured.

After that, portions of the flexible substrate which are exposed between the antennas are cut with a cutter 235, thereby semiconductor devices each of which includes a semiconductor integrated circuit and an antenna can be manufactured.

By using the manufacturing apparatus of a semiconductor device in this embodiment mode, a plurality of steps can be continuously performed. Furthermore, by picking up a plurality of semiconductor integrated circuits and attaching them to a plurality of antennas, a plurality of semiconductor devices can be manufactured. Therefore, a tact time can be reduced and mass productivity can be improved. Thus, a manufacturing apparatus capable of manufacturing a semiconductor device at low cost can be provided.

Embodiment Mode 3

In this embodiment mode, examples of a manufacturing method of a semiconductor device is described with reference to FIGS. 5A and 5B, and 6A to 6C, which vary depending on which surface of the semiconductor integrated circuit over the support means 201 is provided with connection terminals. Note that in this embodiment mode, although description will be made by using the manufacturing apparatus of a semiconductor device shown in FIGS. 2A to 2D, the manufacturing apparatuses of a semiconductor device shown in FIGS. 3A to 4D can also be used as appropriate.

Figure 5A:
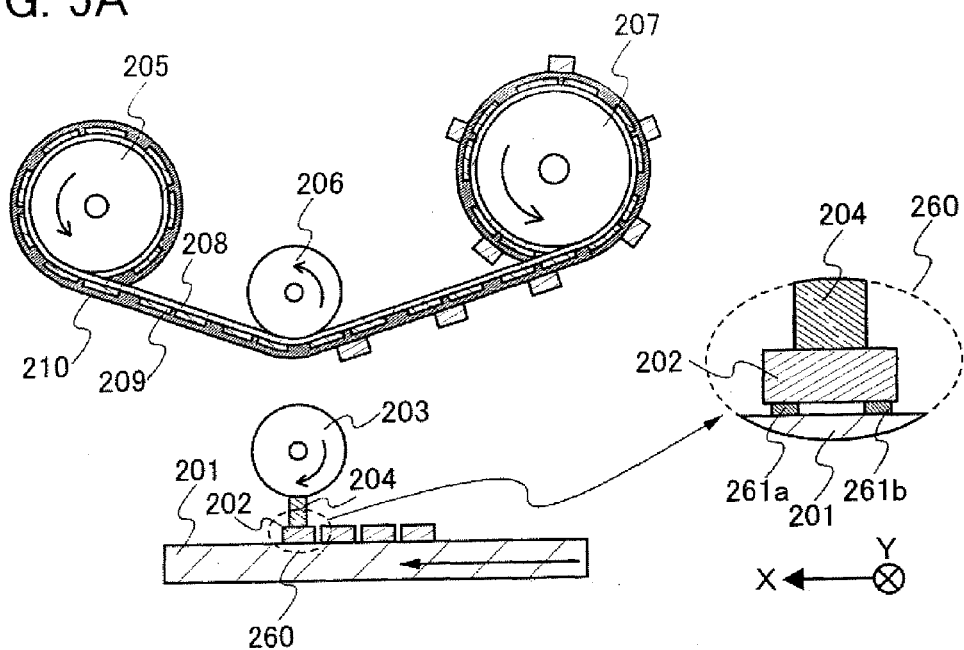
FIGS. 5A and 5B are cross-sectional diagrams illustrating a manufacturing method of a semiconductor device of the invention.
Figure 5B:
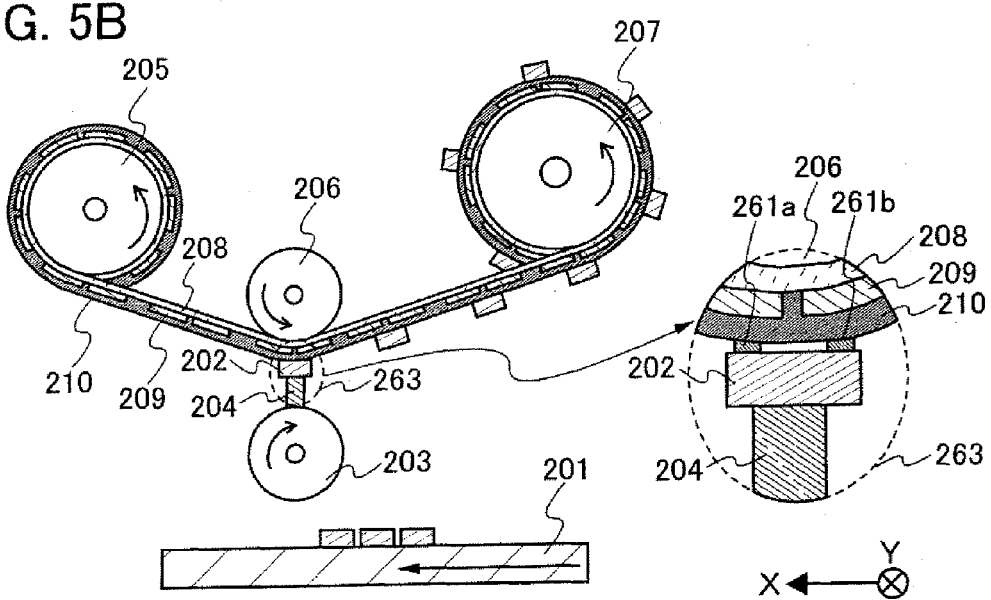
Figure 6A:
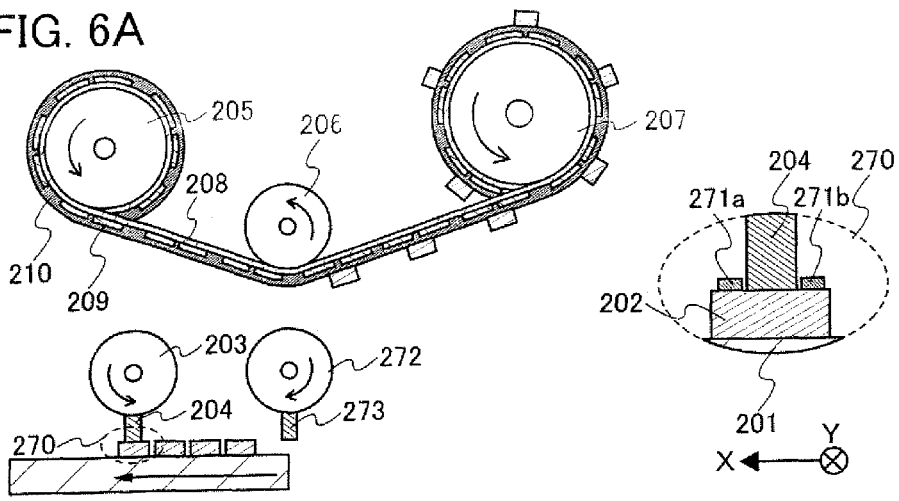
FIGS. 6A to 6C are cross-sectional diagrams illustrating a manufacturing method of a semiconductor device of the invention.
Figure 6B:
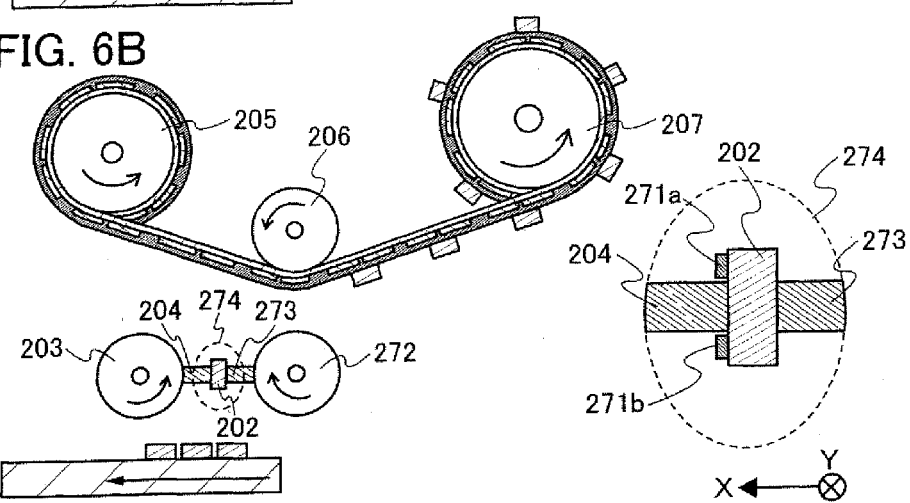
Figure 6C:
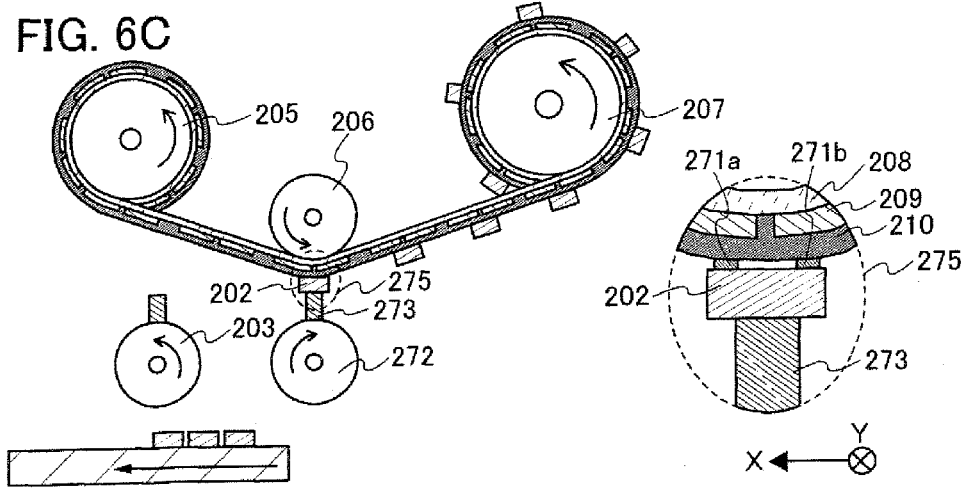

FIGS. 5A and 5B show cross sections of a manufacturing apparatus of a semiconductor device in the x-axis direction, similarly to FIGS. 2A and 2C. Although not shown in FIGS. 5A and 5B, a plurality of holders are arranged in a row in the y-axis direction of the roller, similarly to FIGS. 2B and 2D. Similarly, FIGS. 6A to 6C show cross sections of a manufacturing apparatus of a semiconductor device in the x-axis direction of the roller. Although not shown in FIGS. 6A to 6C, a plurality of holders are also arranged in a row in the y-axis direction of the roller.

As shown in a magnified view 260 in FIG. 5A, description will be made of an example where connection terminals 261a and 261b of the semiconductor integrated circuit 202 face the support means 201, but are not exposed to the holder 204 side. In this manner, the structure where the connection terminals 261a and 261b of the semiconductor integrated circuit 202 face the support means 201 may be obtained through the steps of: forming through-holes for connecting semiconductor elements in the semiconductor integrated circuit 202, and filling the through-holes with plugs so that the plugs can be used as the connection terminals 261a and 261b. Alternatively, after forming connection terminals on the surface of the semiconductor integrated circuit, the semiconductor integrated circuit may be flipped to be provided on the support means 201 so that the connection terminals face the support means 201.

Similarly to FIGS. 2A and 2B, the semiconductor integrated circuit 202 provided over the support means 201 is caught and held by one of the holders 204 arranged in a row on the roller 203. As shown in the magnified view 260 of the region where the holder 204 holds the semiconductor integrated circuit 202, a surface of the semiconductor integrated circuit 202 on which the connection terminals 261a and 261b are formed faces the support means 201 side, and on the opposite surface thereof, the holder 204 holds the semiconductor integrated circuit 202.

Next, by rotating the roller 203 in the opposite direction to or the same direction as the roller 206, the semiconductor integrated circuits 202 are picked up from the support means 201. Next, although not shown in the drawing, the pitch of the holders 204 arranged in a row is widened in the y-axis direction by a controller so that the connection terminals of the semiconductor integrated circuits 202 can be positioned opposite the respective connection terminals of the antennas 209.

Next, as shown in FIG. 5B, when the roller 203 and the holders 204 arranged in a row have moved to a position opposite the flexible substrate 208 and the antennas 209, one or both of pressure treatment and thermal treatment is/are performed using the roller 206 and the holders 204, thereby the semiconductor integrated circuits 202 are mounted on the respective antennas 209 formed over the flexible substrate 208. By appropriately controlling the distance between the roller 206 and the holders 204 and the rotation speed of the pair of the rollers 203 and 206, the semiconductor integrated circuits 202 can be mounted on the respective antennas 209 formed over the flexible substrate 208. As shown in a magnified view 263 of the connection terminals of the semiconductor integrated circuit 202 and the antenna 209, the antenna 209 and the semiconductor integrated circuit 202 are connected to each other through the anisotropic conductive film 210.

After that, the flexible substrate 208 having the antennas 209 and the semiconductor integrated circuits 202 mounted on the respective antennas 209 can be collected by the roller 207.

Next, as shown in a magnified view 270 in FIG. 6A, description will be made of an example where connection terminals 271a and 271b of the semiconductor integrated circuit 202 face the holder 204 side, but are not exposed to the support means 201 side.

The semiconductor integrated circuit whose connection terminals 271a and 271b face the holder 204 is picked up by the holder 204 of the roller 203. The connection terminals 271a and 271b do not face the antenna 209 even when the jig is rotated. Therefore, the manufacturing apparatus of a semiconductor device requires a flip-chip means for flipping the semiconductor integrated circuit 202, in addition to the jig. Here, the flip-chip means is constructed from a roller 272 and holders 273 provided on the roller 272.

As the roller 272 which forms the flip-chip means, the one similar to the rollers 203, 205, 206, and 207 can be used. It is preferable that the number of the holders 273 be about equal to that of the holders 204, and the holders 273 be arranged in a row with a similar pitch to the holders 204. As a result, all of the semiconductor integrated circuits 202 which are picked up by the holders 204 can be delivered to the holders 273.

The roller 272 rotates in the opposite direction to or the same direction as the roller 203. The roller 272 of the flip-flop means and the roller 206 are provided so that their rotation axes are parallel with each other, with the antennas 209 and the flexible substrate 208 therebetween. As a result, the semiconductor integrated circuits 202 which are picked up from the support means 201 by using the roller 203 and the holders 204 thereon (i.e., jig) are transferred to the roller 272 and the holders 273 thereon (i.e., flip-chip means).

Next, by rotating the roller 272 which is the flip-chip means, the flexible substrate 208 having the antennas 209 and the semiconductor integrated circuits 202 can be attached to each other by the holders 273 and the roller 206.

A manufacturing method of a semiconductor device is described with reference to FIGS. 6A to 6C.

As shown in FIG. 6A, the semiconductor integrated circuits 202 provided over the support means 201 are picked up by the holders 204 on the roller 203, similarly to FIGS. 2A and 2B. As shown in the magnified view 270 of the region where the holder 204 holds the semiconductor integrated circuit 202, the connection terminals 271a and 271b of the semiconductor integrated circuit 202 face the holder 204. The holder 204 holds the semiconductor integrated circuit 202 in a region where the connection terminals 271 and 271b are not formed.

Next, as shown in FIG. 68, by rotating the roller 203 in the opposite direction to the roller 272, the semiconductor integrated circuits 202 are transferred from the holders 204 of the jig to the holders 273 of the flip-chip means. As shown in a magnified view 274 of a region where the holders 204 and 273 hold the semiconductor integrated circuit 202 therebetween, the semiconductor integrated circuit 202 is held by the holder 273 such that the holder 273 faces a surface opposite to the surface where the connection terminals 271a and 271b of the semiconductor integrated circuit 202 are formed.

Note that instead of the above method, one or both of the rollers 203 and 272 may be provided with a moving means for moving the rotation axis (axes) of the roller(s). In that case, the rotation of the rollers 203 and 272 is stopped when the holders 204 of the roller 203 are positioned opposite the holders 273 of the roller 272 with the semiconductor integrated circuits 202 therebetween. Next, by moving one or both of the rollers 203 and 272 so that their rotation axes get close to each other, using the moving means for moving the rotation axis (axes) of one or both of the rollers 203 and 272, the semiconductor integrated circuits 202 may be transferred from the holders 204 to the holders 273.

Next, although not shown in the drawing, the pitch of the holders 273 is widened in the y-axis direction by a controller so that the connection terminals of the semiconductor integrated circuits 202 and the antennas 209 can be positioned opposite each other.

Next, as shown in FIG. 6C, the roller 206 is rotated in the opposite direction to or the same direction as the roller 272.

Thus, while holding the flexible substrate 208, the antennas 209, the anisotropic conductive film 210, and the semiconductor integrated circuits 202 between the roller 206 and the holders 273, one or both of pressure treatment and thermal treatment is/are performed. Thus, the semiconductor integrated circuits 202 are mounted on the respective antennas 209 formed over the flexible substrate 208. As shown in a magnified view 275 of the connection terminals of the semiconductor integrated circuit 202 and the antenna 209, the antenna 209 and the semiconductor integrated circuit 202 are connected to each other through the anisotropic conductive film 210.

Alternatively, the following method can be used instead of the above method to mount the semiconductor integrated circuits 202 on the respective antennas 209 over the flexible substrate 208. When the semiconductor integrated circuits 202 have moved to a position opposite the antennas 209 by rotating the roller 272, the rotation of the rollers 203, 205 to 207, and 272 is stopped. Next, although not shown in the drawing, the pitch of the holders 273 is widened in the y-axis direction by a controller so that the connection terminals of the semiconductor integrated circuits 202 can be positioned opposite the respective connection terminals of the antennas 209. Next, the roller 272 is moved to the roller 206 side by a moving means for moving the rotation axis of the roller 272. Next, while holding the flexible substrate 208, the antennas 209, the anisotropic conductive film 210, and the semiconductor integrated circuits 202 between the holders 273 and the roller 206, one or both of pressure treatment and thermal treatment is/are performed, thereby the semiconductor integrated circuits 202 are mounted on the respective antennas 209 formed over the flexible substrate 208. Next, the roller 272 is moved to the support means 201 side by the moving means for moving the rotation axis of the roller 272. After that, the rollers 203, 205 to 207, and 272 are rotated.

As a further alternative, the following method can be used instead of the above methods to mount the semiconductor integrated circuits 202 on the respective antennas 209 over the flexible substrate 208. When the semiconductor integrated circuits 202 have moved to a position opposite the antennas 209 by rotating the roller 272, the rotation of the rollers 203, 205 to 207, and 272 is stopped. Next, although not shown in the drawing, the pitch of the holders 273 is widened in the y-axis direction by a controller so that the connection terminals of the semiconductor integrated circuits 202 can be positioned opposite the respective connection terminals of the antennas 209. Next, with the condition that the rollers 203, 205 to 207, and 272 do not rotate, the rollers 205 to 207 are moved to the holders 273 side by moving means for moving the rotation axes of the rollers 205 to 207. Next, while holding the flexible substrate 208, the antennas 209, the anisotropic conductive film 210, and the semiconductor integrated circuits 202 between the roller 206 and the holders 273, one or both of pressure treatment and thermal treatment is/are performed, thereby the semiconductor integrated circuits 202 are mounted on the respective antennas 209 formed over the flexible substrate 208. Next, after moving the rollers 205 to 207 away from the support means 201 by the moving means for moving the rotation axes of the rollers 205 to 207, the rollers 203, 205 to 207, and 272 are rotated.

As a further alternative, the following method can be used instead of the above methods to mount the semiconductor integrated circuits 202 on the respective antennas 209 over the flexible substrate 208. When the semiconductor integrated circuits 202 have moved to a position opposite the antennas 209 by rotating the roller 272, the rotation of the rollers 203, 205 to 207, and 272 is stopped. Next, although not shown in the drawing, the pitch of the holders 273 is widened in the y-axis direction by a controller so that the connection terminals of the semiconductor integrated circuits 202 can be positioned opposite the respective connection terminals of the antennas 209. Next, with the condition that the rollers 203, 205 to 207, and 272 do not rotate, the holders 273 are stretched to the roller 206 side by a means for controlling the telescopic movement of the holders 273. Next, while holding the flexible substrate 208, the antennas 209, the anisotropic conductive film 210, and the semiconductor integrated circuits 202 between the holders 273 and the roller 206, one or both of pressure treatment and thermal treatment is/are performed, thereby the semiconductor integrated circuits 202 are mounted on the respective antennas 209 formed over the flexible substrate 208. Next, after shrinking the holders 273 by the means for controlling the telescopic movement of the holders 273, the rollers 203, 205 to 207, and 272 are rotated.

After that, the flexible substrate 208 having the antennas 209 with the semiconductor integrated circuits 202 attached is collected by the roller 207.

By the above manufacturing method of a semiconductor device, a plurality of semiconductor devices can be manufactured by picking up a plurality of semiconductor integrated circuits and attaching them to a plurality of antennas, regardless of a position where the connection terminals of the semiconductor integrated circuits are formed. Therefore, a tact time can be reduced and mass productivity can be improved. Thus, a manufacturing apparatus capable of manufacturing a semiconductor device at low cost can be provided.

Embodiment Mode 4

In this embodiment mode, a jig which is applicable to Embodiment Mode 2 or 3 is described with reference to FIGS. 7A, 7B, 8A and 8B.

Figure 7A:
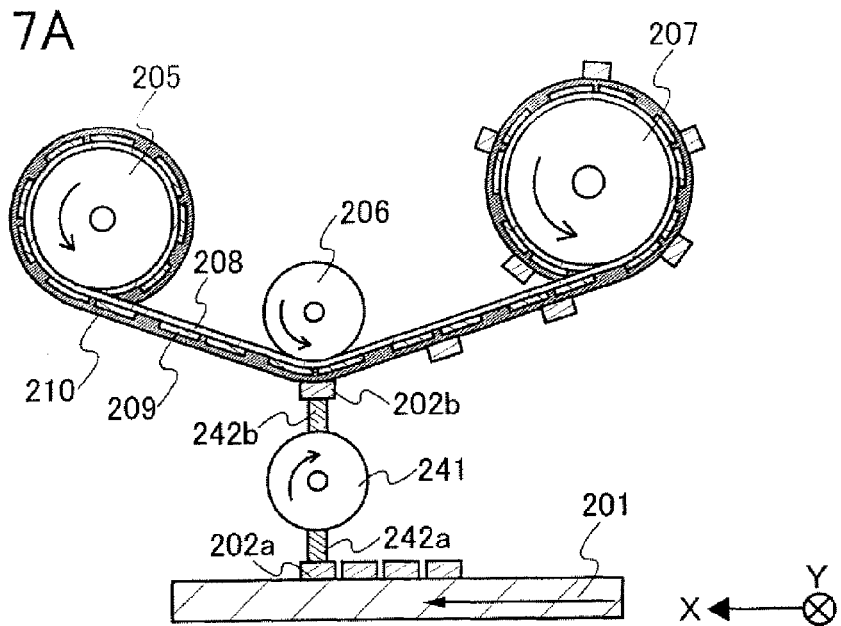
FIGS. 7A and 7B are cross-sectional diagrams illustrating a manufacturing method of a semiconductor device of the invention.
Figure 7B:
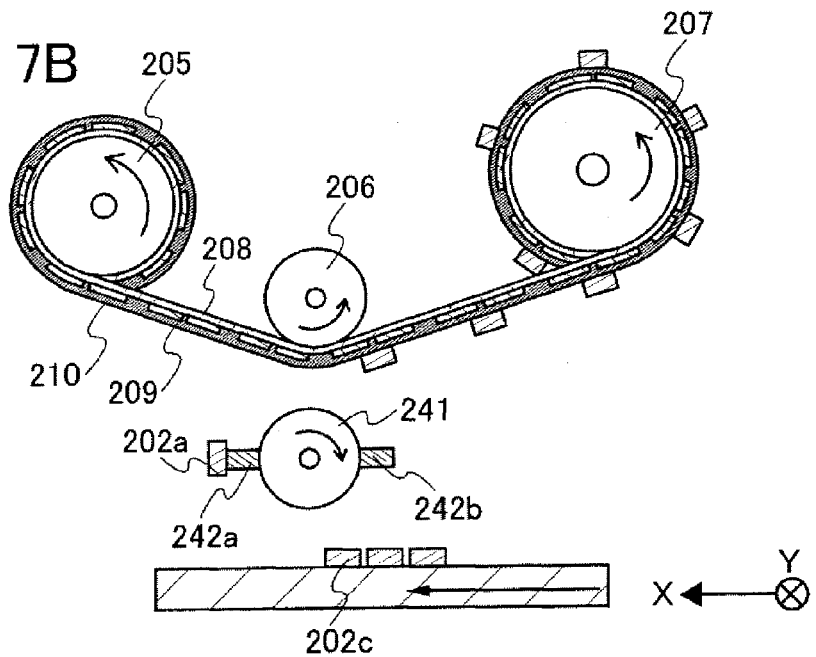

A manufacturing apparatus of a semiconductor device shown in FIGS. 7A and 7B has a jig in which a roller 241 is provided with 2n (n is natural number) sets of holders. In FIGS. 7A and 7B, a jig in which the roller 241 is provided with two sets of holders 242a and 242b is shown. A pair of the holders 242a and 242b are preferably provided to be symmetrical about the rotation axis of the roller 241. As a result, a row of semiconductor integrated circuits over the support means 201 can be picked up, while at the same time another row of semiconductor integrated circuits can be attached to the flexible substrate 208 having antennas during a rotation of ½n. Therefore, throughput can be improved.

Here, by rotating the rollers 206 and 241 in opposite directions or in the same direction, semiconductor integrated circuits 202a over the support means 201 can be picked up by the holders 242a, while at the same time semiconductor integrated circuits 202b can be mounted on the respective antennas 209 by the holders 242b.

Next, as shown in FIG. 7B, the rollers 205 to 207 are rotated to move the flexible substrate 208 having the antennas 209. In addition, the roller 241 is also rotated so that the semiconductor integrated circuits 202a which have been picked up from the support means 201 by the holders 242a are put close to the antennas 209, while at the same time the holders 242b are put close to the support means 201. After that, the semiconductor integrated circuits 202a can be mounted on the respective antennas 209, while at the same time semiconductor integrated circuits 202c over the support means 201 can be picked up by the holders 242b.

Note that although not shown in the drawing, before putting the semiconductor integrated circuits 202a close to the antennas 209, the pitch of the holders 242a is widened in the y-axis direction so that the holders 242a can be positioned opposite the respective connection terminals of the antennas 209. On the other hand, before picking up the semiconductor integrated circuits 202c by the holders 242b, the pitch of the holders 242b is shrunk in the y-axis direction so that the holders 242b can be positioned opposite the respective connection terminals of the semiconductor integrated circuits 202c.

Alternatively, the following method can be used instead of the above method to pick up a row of semiconductor integrated circuits from the support means 201 and also to mount another row of semiconductor integrated circuits on the respective antennas 209 over the flexible substrate 208. When the semiconductor integrated circuits 202b have moved to a position opposite the antennas 209 and also when the holders 242a have moved to a position opposite the semiconductor integrated circuits 202a over the support means 201, by rotating the roller 241, the movement of the support means 201 and the rotation of the rollers 205 to 207 and 241 are stopped, Next, although not shown in the drawing, the pitch of the holders 242b is widened in the y-axis direction by a controller so that the connection terminals of the semiconductor integrated circuits 202b can be positioned opposite the respective connection terminals of the antennas 209. Next, while holding the flexible substrate 208, the antennas 209, the anisotropic conductive film 210, and the semiconductor integrated circuits 202b between the holders 242b and the roller 206, one or both of pressure treatment and thermal treatment is/are performed, thereby the semiconductor integrated circuits 202b are mounted on the respective antennas 209 formed over the flexible substrate 208.

Next, by moving the roller 241 to the support means 201 side by the moving means for moving the rotation axis of the roller 241, the semiconductor integrated circuits 202a over the support means 201 are caught and held by the holders 242a. Then, the roller 241 is moved to the roller 206 side by the moving means for moving the rotation axis of the roller 241, so that the semiconductor integrated circuits 202a are picked up, upon which the roller 241 is moved to a position where the holders 242a and 242b have no contact with the flexible substrate 208, the antennas 209, and the anisotropic conductive film 210. After that, the movement of the support means 201 and the rotation of the rollers 205 to 207 and 241 are resumed.

As a further alternative, the following method can be used to pick up a row of semiconductor integrated circuits from the support means 201 and also to mount another row of semiconductor integrated circuits on the respective antennas 209 over the flexible substrate 208. When the semiconductor integrated circuits 202b have moved to a position opposite the antennas 209 by rotating the roller 241, the movement of the support means 201 and the rotation of the rollers 205 to 207 and 241 are stopped. Next, although not shown in the drawing, the pitch of the holders 242b is widened in the y-axis direction by a controller so that the connection terminals of the semiconductor integrated circuits 202b can be positioned opposite the respective connection terminals of the antennas 209. Next, with the condition that the rollers 205 to 207 and 241 do not rotate, the rollers 205 to 207 are moved to the holders 242b side by moving means for moving the rotation axes of the rollers 205 to 207. Next, while holding the flexible substrate 208, the antennas 209, the anisotropic conductive film 210, and the semiconductor integrated circuits 202b between the roller 206 and the holders 242b, one or both of pressure treatment and thermal treatment is/are performed, thereby the semiconductor integrated circuits 202b are mounted on the respective antennas 209 fowled over the flexible substrate 208.

Next, the rollers 205 to 207 are moved away from the roller 241 by the moving means for moving the rotation axes of the rollers 205 to 207. Next, the roller 241 is moved to the side of the semiconductor integrated circuits 202a by a moving means for moving the rotation axis of the roller 241, so that the semiconductor integrated circuits 202a over the support means 201 are caught and held by the holders 242a. Then, the roller 241 is moved to the roller 206 side by the moving means for moving the rotation axis of the roller 241, so that the semiconductor integrated circuits 202a are picked up. Then, the roller 241 is moved to a position where the holders 242a and 242b have no contact with the flexible substrate 208, the antennas 209, and the anisotropic conductive film 210. After that, the movement of the support means 201 and the rotation of the rollers 205 to 207 and 241 are resumed.

As a further alternative, the following method can be used to pick up a row of semiconductor integrated circuits from the support means 201 and also to mount another row of semiconductor integrated circuit on the respective antennas 209 over the flexible substrate 208. When the semiconductor integrated circuits 202b have moved to a position opposite the antennas 209 by rotating the roller 241, the movement of the support means 201 and the rotation of the rollers 205 to 207 and 241 are stopped. Next, although not shown in the drawing, the pitch of the holders 242b is widened in the y-axis direction by a controller so that the connection terminals of the semiconductor integrated circuits 202b can be positioned opposite the respective connection terminals of the antennas 209. Next, with the condition that the rollers 205 to 207 and 241 do not rotate, the holders 242b are stretched to the roller 206 side by a means for controlling the telescopic movement of the holders 242b. Next, while holding the flexible substrate 208, the antennas 209, the anisotropic conductive film 210, and the semiconductor integrated circuits 202b between the holders 242b and the roller 206, one or both of pressure treatment and thermal treatment is/are performed, thereby the semiconductor integrated circuits 202b are mounted on the respective antennas 209 formed over the flexible substrate 208. Next, the holders 242b are shrunk by the means for controlling the telescopic movement of the holders 242b.

Next, the holders 242a are stretched to the support means 201 side by a means for controlling the telescopic movement of the holders 242a, thereby the semiconductor integrated circuits 202a over the support means 201 are caught and held by the holders 242a, so that the semiconductor integrated circuits 202a are picked up. Next, after shrinking the holders 242a by the means for controlling the telescopic movement of the holders 242a, the holders 242a and 242b are set in positions having no contact with the flexible substrate 208, the antennas 209, and the anisotropic conductive film 210. After that, the movement of the support means 201 and the rotation of the rollers 205 to 207 and 241 are resumed.

Through the above steps, a row of semiconductor integrated circuits can be attached to respective antennas, while at the same time another row of semiconductor integrated circuits over the support means can be picked up by holders, during the period in which the roller 241 rotates by 360 degrees.

Next, an example of a manufacturing apparatus of a semiconductor device having a jig in which a roller 251 is provided with 2n+1 (n is natural number) sets of holders is described, with reference to FIGS. 8A and 8B. In FIGS. 8A and 8B, a jig in which the roller 251 is provided with three sets of holders 252a to 252c is shown. Here, each set of holders is preferably provided at even intervals around the rotation axis of the roller 251 (at 360/(2n+1) degrees). As a result, it becomes possible to perform a step of picking up a row of semiconductor integrated circuits over the support means 201 by holders, and a step of attaching another row of semiconductor integrated circuit to the flexible substrate 208 having the antennas 209 by holders, at different timing, whereby each step can be prevented from interfering with the other step. As a result, each step can be surely performed. Here, each set of holders is disposed at intervals of 120° C. around the rotation axis.

Here, by rotating the rollers 206 and 251 in opposite directions or in the same direction, the semiconductor integrated circuits 202c over the support means 201 can be picked up by the holders 252c.

Next, as shown in FIG. 8B, the flexible substrate 208 having the antennas 209 is moved by rotating the rollers 205 to 207. In addition, by rotating the roller 251, the semiconductor integrated circuits 202a which have been picked up from the support means 201 by the holders 252a can be attached to the respective antennas 209.

Note that although not shown in the drawing, before putting the semiconductor integrated circuits 202a close to the antennas 209, the pitch of the holders 252a is widened in the y-axis direction so that the holders 252a can be positioned opposite the respective connection terminals of the antennas 209. On the other hand, before picking up the semiconductor integrated circuits 202c by the holders 252c, the pitch of the holders 252c is narrowed in the y-axis direction so that the holders 252c can be positioned opposite the respective connection terminals of the semiconductor integrated circuits 202e.

Alternatively, the following method can be used to pick up a row of semiconductor integrated circuits from the support means 201 and also to mount another row of semiconductor integrated circuits on the respective antennas 209 over the flexible substrate 208. When the holders 252c have moved to a position opposite the semiconductor integrated circuits 202c by rotating the roller 251, the movement of the support means 201 and the rotation of the rollers 205 to 207 and 251 are stopped. Next, the roller 251 is moved to the support means 201 side by a moving means for moving the rotation axis of the roller 251, thereby the semiconductor integrated circuits 202c over the support means 201 are caught and held by the holders 252c. Next, by moving the roller 251 to the roller 206 side by the moving means for moving the rotation axis of the roller 251, the semiconductor integrated circuits 202c are picked up. After that, the roller 251 is moved to a position where the holders 252a to 252c have no contact with the flexible substrate 208, the antennas 209, and the anisotropic conductive film 210. Next, the movement of the support means 201 and the rotation of the rollers 205 to 207 and 251 are resumed.

Next, as shown in FIG. 8B, when the semiconductor integrated circuits 202a have moved to a position opposite the antennas 209, the movement of the support means 201 and the rotation of the rollers 205 to 207 and 251 are stopped. Next, although not shown in the drawing, the pitch of the holders 252a is widened in the y-axis direction by a controller so that the connection terminals of the semiconductor integrated circuits 202a can be positioned opposite the respective connection terminals of the antennas 209. Next, the roller 251 is moved to the roller 206 side by the moving means for moving the rotation axis of the roller 251. Then, while holding the flexible substrate 208, the antennas 209, the anisotropic conductive film 210, and the semiconductor integrated circuits 202a between the roller 206 and the holders 252a, one or both of pressure treatment and thermal treatment is/are performed, thereby the semiconductor integrated circuits 202a can be mounted on the respective antennas 209 formed over the flexible substrate 208.

Although not shown in the drawing, after mounting the semiconductor integrated circuits 202a on the respective antennas 209, the pitch of the holders 252a is narrowed in the y-axis direction.

As a further alternative, the following method can be used to pick up a row of semiconductor integrated circuits from the support means 201 and also to mount another row of semiconductor integrated circuits on the respective antennas 209 over the flexible substrate 208. When the holders 252c have moved to a position opposite the semiconductor integrated circuits 202c by rotating the roller 251, the movement of the support means 201 and the rotation of the rollers 205 to 207 and 251 are stopped. Next, the roller 251 is moved to the support means 201 side by a moving means for moving the rotation axis of the roller 251, thereby the semiconductor integrated circuits 202c over the support means 201 are picked up by the holders 252c. Next, by moving the roller 251 to the roller 206 side by the moving means for moving the rotation axis of the roller 251, the holders 252a to 252c are set in positions having no contact with the flexible substrate 208, the antenna 209, and the anisotropic conductive film 210. After that, the movement of the support means 201 and the rotation of the rollers 205 to 207 and 251 are resumed.

Next, as shown in FIG. 8B, when the semiconductor integrated circuits 202a have moved to a position opposite the antennas 209, the movement of the support means 201 and the rotation of the rollers 205 to 207 and 251 are stopped. Next, although not shown in the drawing, the pitch of the holders 252a is widened in the y-axis direction by a controller so that the connection terminals of the semiconductor integrated circuits 202a can be positioned opposite the respective connection terminals of the antennas 209. Next, with the condition that the rollers 205 to 207 and 251 do not rotate, the rollers 205 to 207 are moved to the holders 252a side by moving means for moving the rotation axes of the rollers 205 to 207. Next, while holding the flexible substrate 208, the antennas 209, the anisotropic conductive film 210, and the semiconductor integrated circuits 202a between the roller 206 and the holders 252a, one or both of pressure treatment and thermal treatment is/are performed, thereby the semiconductor integrated circuits 202a can be mounted on the respective antennas 209 formed over the flexible substrate 208.

Next, the roller 20b is moved away from the roller 251 by the moving means for moving the rotation axes of the rollers 205 to 207.

Although not shown in the drawing, after mounting the semiconductor integrated circuits 202a on the respective antennas 209, the pitch of the holders 252a is narrowed in the y-axis direction.

As a further alternative, the following method can be used to pick up a row of semiconductor integrated circuits from the support means 201 and also to mount another row of semiconductor integrated circuits on the respective antennas 209 over the flexible substrate 208. When the holders 252c have moved to a position opposite the semiconductor integrated circuits 202e by rotating the roller 251, the movement of the support means 201 and the rotation of the rollers 205 to 207 and 251 are stopped. The holders 252c are stretched to the support means 201 side by a means for controlling the telescopic movement of the holders 252c, thereby the semiconductor integrated circuits 202e over the support means 201 are caught and held by the holders 252c. Next, by shrinking the holders 252c by the means for controlling the telescopic movement of the holders 252c, and picking up the semiconductor integrated circuits 202e, the holders 252a to 252c are set in positions having no contact with the flexible substrate 208, the antennas 209, and the anisotropic conductive film

210. After that, the movement of the support means 201 and the rotation of the rollers 205 to 207 and 251 are resumed.

Next, as shown in FIG. 8B, when the semiconductor integrated circuits 202a have moved to a position opposite the antennas 209, the movement of the support means 201 and the rotation of the rollers 205 to 207 and 251 are stopped. Next, although not shown in the drawing, the pitch of the holders 252a is widened in the y-axis direction by a controller so that the connection terminals of the semiconductor integrated circuits 202a can be positioned opposite the respective connection terminals of the antennas 209. Next, with the condition that the rollers 205 to 207 and 251 do not rotate, the holders 252a are stretched to the roller 206 side by the means for controlling the telescopic movement of the holders 252a. Next, while holding the flexible substrate 208, the antennas 209, the anisotropic conductive film 210, and the semiconductor integrated circuits 202a between the holders 252a and the roller 206, one or both of pressure treatment and thermal treatment is/are performed, thereby the semiconductor integrated circuits 202a are mounted on the respective antennas 209 formed over the flexible substrate 208. Next, the holders 252a are shrunk by the means for controlling the telescopic movement of the holders 252a.

Through the above steps, a row of semiconductor integrated circuits can be attached to respective antennas, while at the same time another row of semiconductor integrated circuits over a support means can be picked up by holders, during the period in which the roller 251 rotates by 360 degrees. Therefore, a plurality of steps can be performed at the same time. Furthermore, a plurality of semiconductor devices can be manufactured by picking up a plurality of semiconductor integrated circuits and attaching them to a plurality of antennas. Therefore, a tact time can be reduced and mass productivity can be improved. Thus, a manufacturing apparatus capable of manufacturing a semiconductor device at low cost can be provided.

Embodiment 1

In this embodiment, a manufacturing process of a semiconductor device capable wireless data transmission is described with reference to FIGS. 6A to 6C, 9A to 9E, 10A to 10D, 11A to 11C, and 12A and 12B. In FIGS. 9A to 9E, 10A to 10D, 11A to 11C, and 12A and 12B, cross sections of the semiconductor device shown in FIGS. 6A to 6C in the y-axis direction are shown.

Figure 9A:
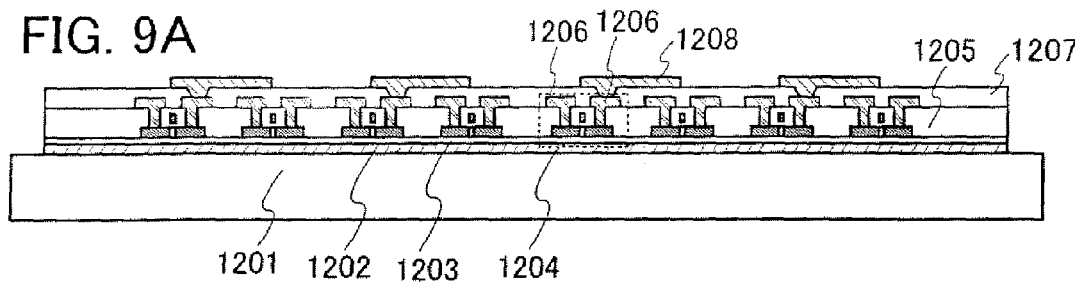
FIGS. 9A to 9E are cross-sectional diagrams illustrating a manufacturing method of a semiconductor device of the invention.

As shown in FIG. 9A, a peeling layer 1202 is formed over a substrate 1201; an insulating layer 1203 is formed over the peeling layer 1202; a thin film transistor 1204 and an interlayer insulating layer 1205 for insulating conductive layers of respective thin film transistors are formed over the insulating layer 1203; and source and drain electrodes 1206 connected to a semiconductor layer of each thin film transistor are formed. Next, an insulating layer 1207 which covers the thin film transistor 1204, the interlayer insulating layer 1205, and the source and drain electrodes 1206 is formed, and a conductive layer 1208 connected to the source or drain electrode 1206 with the insulating layer 1207 interposed therebetween is formed.

As the substrate 1201, a glass substrate, a quartz substrate, a metal substrate or a stainless steel substrate having an insulating layer formed on its surface, a plastic substrate which can withstand the treatment temperature of the process in this embodiment, or the like is used. The above substrate 1201 has no limitations on size and shape. Therefore, if a rectangular substrate with one meter or longer on a side is used as the substrate 1201, productivity can be significantly improved. This is a great advantage as compared with the case of using a circular silicon substrate.

The peeling layer 1202 is formed to have either a single layer or stacked layers by a sputtering method, a plasma CVD method, a coating method, or a printing method, using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), and silicon (Si), or an alloy material or a compound material containing such an element as a main component. When the peeling layer 1202 is a layer containing silicon, any of an amorphous structure, a microcrystalline structure, and a polycrystalline structure can be used.

When the peeling layer 1202 has a single-layer structure, it is preferable to form a tungsten layer, a molybdenum layer, or a layer containing a compound of tungsten and molybdenum. Alternatively, the peeling layer 1202 is formed using a tungsten oxide layer, a tungsten oxynitride layer, a molybdenum oxide layer, a molybdenum oxynitride layer, or a layer containing oxide or oxynitride of a compound of tungsten and molybdenum. Note that the compound of tungsten and molybdenum corresponds to, for example, an alloy of tungsten and molybdenum.

When the peeling layer 1202 has a stacked-layer structure, it is preferable to form, as a first layer, a tungsten layer, a molybdenum layer, or a layer containing a compound of tungsten and molybdenum, and form, as a second layer, oxide, nitride, oxynitride, or nitride oxide of tungsten, molybdenum, or a compound of tungsten and molybdenum.

Note that when the peeing layer 1202 is formed to have a stacked-layer structure of a tungsten layer and a tungsten oxide layer, the tungsten layer may be formed first and an insulating layer made of oxide may be formed thereon so that a tungsten oxide layer is formed in the interface between the tungsten layer and the insulating layer. Furthermore, it is also possible to form a tungsten oxide layer by performing thermal oxidation treatment, oxygen plasma treatment, $N_2O$ plasma treatment, treatment with a solution having strong oxidation power such as ozone water or water containing hydrogen, or the like to the surface of the tungsten layer. The same can be said for the case of forming a tungsten nitride layer, a tungsten oxynitride layer, or a tungsten nitride oxide layer. For example, it is preferable to form a tungsten layer first, and then form a silicon nitride layer, a silicon oxynitride layer, or a silicon nitride oxide layer on the tungsten layer.

Tungsten oxide is represented by $WO_x$, where x is in the range of 2 to 3, inclusive. There are cases where x is 2 ($WO_2$), x is 2.5 ($W_2O_5$), x is 2.75 ($W_4O_{11}$), x is 3 ($WO_3$), and the like.

Although the peeling layer 1202 is formed so as to contact the substrate 1201 in the above step, the invention is not limited to this step. For example, it is possible to form a base insulating layer to contact the substrate 1201, and then form the peeling layer 1202 to contact the insulating layer.

The insulating layer 1203 is formed to have either a single layer or stacked layers by a sputtering method, a plasma CVD method, a coating method, a printing method, or the like, using an inorganic compound. As typical examples of the inorganic compound, silicon oxide and silicon nitride can be given.

Furthermore, the insulating layer 1203 may have a stacked-layer structure. For example, the insulating layer 1203 may be formed by stacking inorganic compounds, and typically by stacking silicon oxide, silicon nitride oxide, and silicon oxynitride.

The thin film transistor 1204 includes a semiconductor layer having a source region, a drain region, and a channel formation region; a gate insulating layer; and a gate electrode.

The semiconductor layer is a layer formed of a semiconductor with a crystalline structure, and either a non-single crystalline semiconductor or a single crystalline semiconductor can be used. In particular, it is preferable to employ a crystalline semiconductor which is crystallized by thermal treatment or a crystalline semiconductor which is crystallized by a combination of thermal treatment and laser light irradiation. For the thermal treatment, a crystallization method can be used, which uses a metal element such as nickel having a function of promoting the crystallization of a silicon semiconductor. Furthermore, by the heating conducted in the crystallization step of the silicon semiconductor, the surface of the peeling layer 1202 is oxidized, so that a metal oxide layer can be formed in the interface between the peeling layer 1202 and the insulating layer 1203.

In the case of performing crystallization by laser light irradiation in addition to the thermal treatment, crystallization can be performed by continuously moving the melt zone in which the crystallization semiconductor is melt, along the laser light irradiation direction, while irradiating the semiconductor layer with a continuous wave laser beam or an ultrashort pulsed laser beam having a repetition rate of 10 MHz or higher and a pulse width of 1 nanosecond or shorter, or preferably in the range of 1 to 100 picoseconds, inclusive. By such a crystallization method, a crystalline semiconductor having crystal grains which have a large grain size and have grown in one direction can be obtained. By aligning the carrier moving direction with the direction in which such crystalline grains are grown, electron field-effect mobility of the transistor can be increased. For example, 400 $cm^2/V \cdot sec$ or higher can be attained.

In the case of using the above crystallization step for a crystallization process at a temperature equal to or lower than the allowable temperature limit of a glass substrate (approximately 600° C.), a large-area glass substrate can be used. Therefore, large quantities of semiconductor devices can be manufactured from one substrate, and thus cost reduction can be achieved.

Alternatively, a semiconductor layer can be formed by performing a crystallization step by heating at a temperature equal to or higher than the allowable temperature limit of a glass substrate. Typically, a quartz substrate is used as the substrate 1201 having an insulating surface, and an amorphous or microcrystalline semiconductor is heated at 700° C. or higher, thereby forming a semiconductor layer. As a result, a highly crystalline semiconductor can be formed. Therefore, a thin film transistor which has excellent properties such as a high response speed and high mobility, and which can operate at high speed can be provided.

The gate insulating layer is formed using an inorganic insulator such as silicon oxide or silicon oxynitride.

The gate electrode can be formed using a metal or a polycrystalline semiconductor which is doped with an impurity having one conductivity type. In the case of using a metal, tungsten (W), molybdenum (Mo), titanium (Ti), tantalum (Ta), aluminum (Al), or the like can be used. Further, a metal nitride which is obtained by nitriding a metal can be used. Alternatively, a structure where a first layer made of the metal nitride and a second layer made of the metal are stacked may be employed. In the case of forming a stacked-layer structure, a shape that the edge of the first layer is wider than the edge of the second layer may be formed. In that case, if the first layer is formed of a metal nitride, it can function as a barrier metal. That is, the metal of the second layer can be prevented from diffusing into the gate insulating layer or the semiconductor layer below the gate insulating layer.

As the thin film transistor which is formed by combining the semiconductor layer, the gate insulating layer, the gate electrode, and the like, various structures can be employed such as a single drain structure, an LDD (Lightly Doped Drain) structure, and a gate overlapped drain structure. Here, a thin film transistor with a single drain structure is shown. Furthermore, a multiple structure where transistors to which the same gate potential is applied are connected in series, a dual gate structure where a semiconductor layer is interposed between gate electrodes, an inversely staggered thin film transistor where a gate electrode is formed over the insulating layer 1203, and a gate insulating layer and a semiconductor layer are formed over the gate electrode, or the like can be used.

The source and drain electrodes 1206 are preferably formed by combining a low-resistance material such as aluminum (Al) and a high-melting-point metal material such as titanium (Ti) or molybdenum (Mo), e.g., a stacked-layer structure of titanium (Ti) and aluminum (Al) or a stacked-layer structure of molybdenum (Mo) and aluminum (Al).

The interlayer insulating layer 1205 and the insulating layer 1207 are formed by using polyimide, acrylic, or siloxane polymers.

Furthermore, any other semiconductor elements which can function as switching elements can be provided in any structure instead of the thin film transistor 1204. As typical examples of the switching element, a MIM (Metal-Insulator-Metal), a diode, and the like can be given.

Figure 9B:
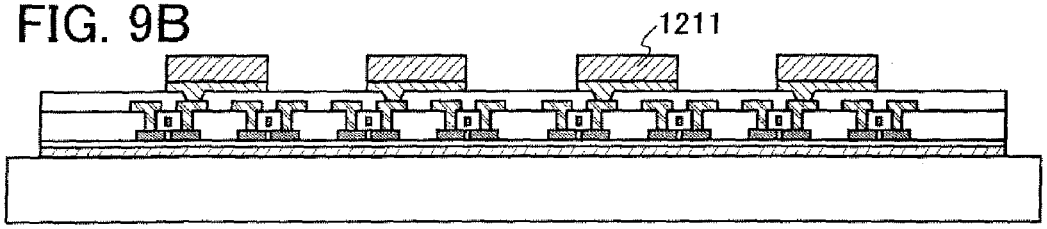

Next, as shown in FIG. 9B, a conductive layer 1211 is formed over the conductive layer 1208. Here, the conductive layer 1211 is formed by printing a composition containing metal particles by a printing method, and then heating and baking the composition at 200° C. for 30 minutes.

Figure 9C:
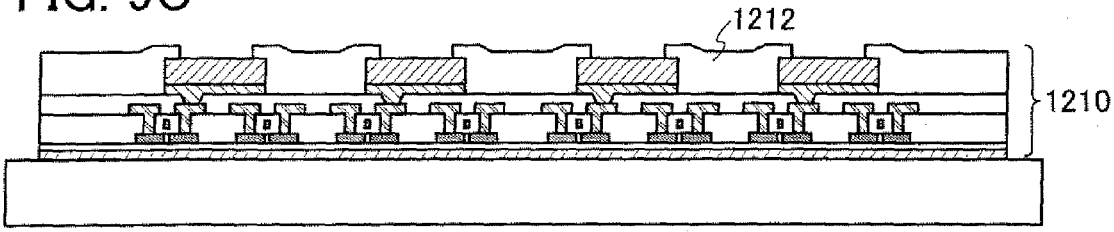

Next, as shown in FIG. 9C, an insulating layer 1212 which covers the insulating layer 1207 and the edge of the conductive layer 1211 is formed. Here, an epoxy resin is applied by a spin coating method and heated at 160° C. for 30 minutes. Then, a portion of the insulating layer 1212 which covers the conductive layer 1211 is removed to expose the conductive layer 1211. Here, a stack having the insulating layer 1203 as the bottom layer and the insulating layer 1212 as the top layer serves as an element formation layer 1210.

Figure 9D:
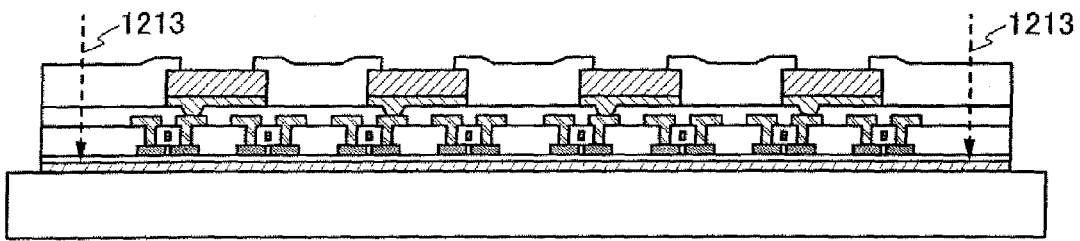
Figure 9E:
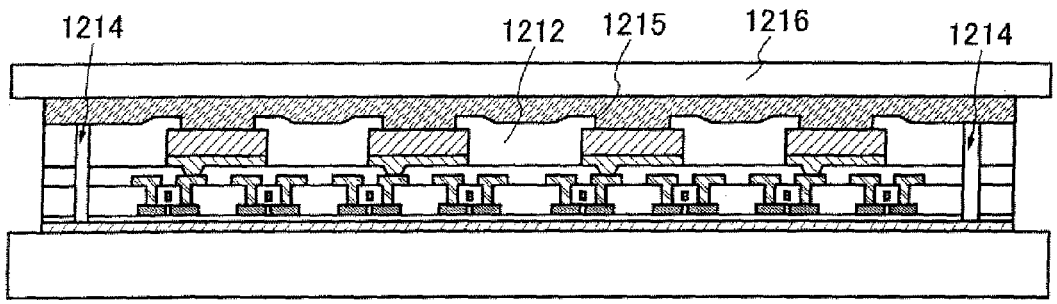

Next, as shown in FIG. 9D, in order to facilitate the later peeling step, the insulating layers 1203, 1205, 1207, and 1212 are irradiated with laser beams 1213 to form openings 1214 as shown in FIG. 9E. As the laser beams used for forming the openings 1214, laser beams having a wavelength which can be absorbed by the insulating layers 1203, 1205, 1207, and 1212 are preferably used. Typically, a laser beam in the UV region, visible region, or infrared region is selected as appropriate for irradiation.

As a laser oscillator which can produce such laser beams, the following can be used: an excimer laser oscillator such as ArF, KrF, or XeCl; a gas laser oscillator such as He, He—Cd, Ar, He—Ne, HF, or $CO_2$; a solid-state laser oscillator of crystals, glass, ruby, or the like, in which crystals such as YAG, $GdVO_4$, $YVO_4$, YLF, or $YAlO_3$ are doped with Cr, Nd, Er. Ho, Ce, Co, Ti, or Tm; or a semiconductor laser oscillator such as GaN, GaAs, GaAlAs, or InGaAsP. Note that in the case of using a solid-state laser oscillator, it is preferable to use the fundamental wave to the fifth harmonic as appropriate. As a result, laser beams are absorbed by the insulating layers 1203, 1205, 1207, and 1212, and thus openings are formed therein.

Note that when the step of irradiating the insulating layers 1203, 1205, 1207, and 1212 with laser beams is omitted, throughput can be improved.

Next, a support base 1216 is attached to the insulating layer 1212 with an adhesive agent 1215.

As the adhesive agent 1215, a peelable adhesive agent can be used, typically such as a UV peelable adhesive agent which can be peeled off by an ultraviolet ray, a heat peelable adhesive agent which can be peeled off by heat, a water-soluble adhesive agent, or a double-sided tape. As a material of the support base 1216, a glass substrate, a quartz substrate, a metal substrate, a plastic substrate, a flexible substrate (e.g., PET, PES, polycarbonate, or paper made of a fibrous material), or the like can be used as appropriate. Here, synthetic paper is used as the support base 1216.

Note that the adhesive strength between the adhesive agent 1215, the support base 1216, and the element formation layer 1210 is set higher than the adhesive strength between the peeling layer 1202 and the insulating layer 1203.

Figure 10A:
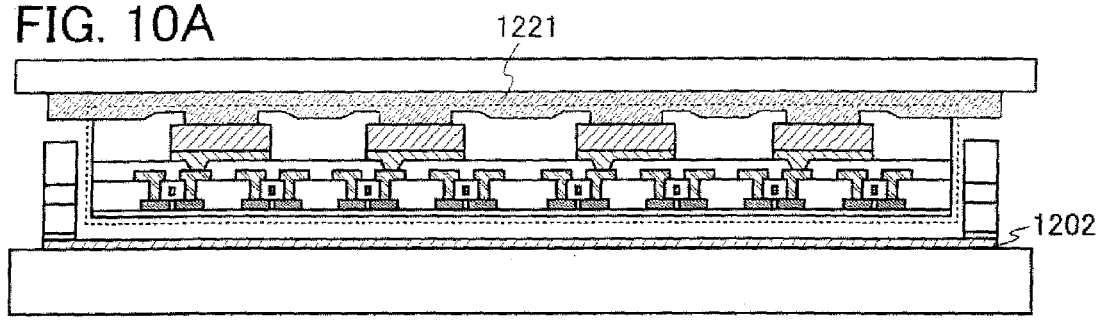
FIGS. 10A to 10D are cross-sectional diagrams illustrating a manufacturing method of a semiconductor device of the invention.

Next, as shown in FIG. 10A, the substrate 1201 having the peeling layer 1202 and a part 1221 of the element formation layer are separated from each other by a physical method at the metal oxide layer which is formed in the interface between the peeling layer 1202 and the insulating layer 1203. A physical method means a mechanical method, i.e., a method of changing certain mechanical energy. Typically, a physical method means an action of applying mechanical force (e.g., peeling with the human hands or with a gripper, or a separation process by rotating a roller as a supporting point).

The above peeling step is characterized in that a layer which does not contract by thermal treatment, a layer which contracts by thermal treatment, and an intermediate layer between the two layers are formed, and thermal treatment is performed at the completion of the peeling step or during the peeling step, so that excess stress is applied to the intermediate layer or to a region in the vicinity of the intermediate layer, and after that, by applying a stimulus to the intermediate layer, separation occurs at the intermediate layer or in the region in the vicinity of the intermediate layer.

In this embodiment, the layer which does not contract by thermal treatment is the peeling layer 1202; the layer which contracts by thermal treatment is the insulating layer 1203 or the insulating layer 1212; and the intermediate layer between the two layers is a metal oxide layer formed in the interface between the peeling layer 1202 and the insulating layer 1203. As a typical example, when a tungsten layer is used as the peeling layer 1202, silicon oxide or silicon nitride is used as the insulating layer 1203, and an epoxy resin is used as the insulating layer 1212, the peeling layer 1202 does not contract by the thermal treatment in crystallization, impurity activation, or dehydrogenation of an amorphous silicon film, while the insulating layer 1203 or the insulating layer 1212 contracts, and further, a tungsten oxide layer (WO$_x$ where $2 \leq x \leq 3$) is formed at the interface between the peeling layer 1202 and the insulating layer 1203. Since a tungsten oxide layer is weak, it can easily be separated by the above physical method. As a result, the part 1221 of the element formation layer can be separated from the substrate 1201 by the above physical method.

Note that when the support base 1216 is a flexible substrate, by providing a pair of rollers at each side in the traveling direction as the supporting points of the support base 1216, setting the support base 1216 on the element formation layer 1210 with the adhesive agent 1215 interposed therebetween, and pushing the support base 1216 with a pressure bond head, the support base 1216 can be attached to the element formation layer 1210 with the adhesive agent 1215 interposed therebetween. Next, after taking away the pressure bond head, the roller of front side is gradually pulled up so that the pair of the rollers have a difference in elevation. As a result, since the rollers are used as the supporting points of the support base 1216, the support base 1216 and the element formation layer 1210 can be gradually peeled from the peeling layer.

Although this embodiment employs a method in which the metal oxide film is formed between the peeling layer and the insulating layer, and the element formation layer 1210 is separated at the metal oxide film by a physical method, the invention is not limited to this. For example, a method can be used in which a light-transmissive substrate is used as the substrate, an amorphous silicon film containing hydrogen is used as the peeling layer, and after the step in FIG. 9E, the amorphous silicon film is irradiated with a laser beam from a substrate side so that hydrogen contained in the amorphous silicon film is vaporized and separation occurs between the substrate and the peeling layer.

Alternatively, after the step in FIG. 9E, a method of removing the substrate by mechanical polishing, or a method of removing the substrate by using a solution such as HF which can dissolve the substrate can be employed. In that case, the peeling layer can be omitted.

As a further alternative, the following method can be used: before attaching the support base 1216 to the insulating layer 1212 by using the adhesive agent 1215 in FIG. 9E, a halogen fluoride gas such as NF$_3$, BrF$_3$, or ClF$_3$ is introduced into the openings 1214 so that the peeling layer is etch-removed by the halogen fluoride gas, and the support base 1216 is attached to the insulating layer 1212 by using the adhesive agent 1215, and then the element formation layer 1210 is separated from the substrate.

As a further alternative, the following method can be used: before attaching the support base 1216 to the insulating layer 1212 by using the adhesive agent 1215 in FIG. 9E, a halogen fluoride gas such as NF$_3$, BrF$_3$, or ClF$_3$ is introduced into the openings 1214 so that the peeling layer is partially etch-removed by the halogen fluoride gas, and the support base 1216 is attached to the insulating layer 1212 with the adhesive agent 1215, and then the element formation layer 1210 is separated from the substrate by a physical method.

Figure 10B:
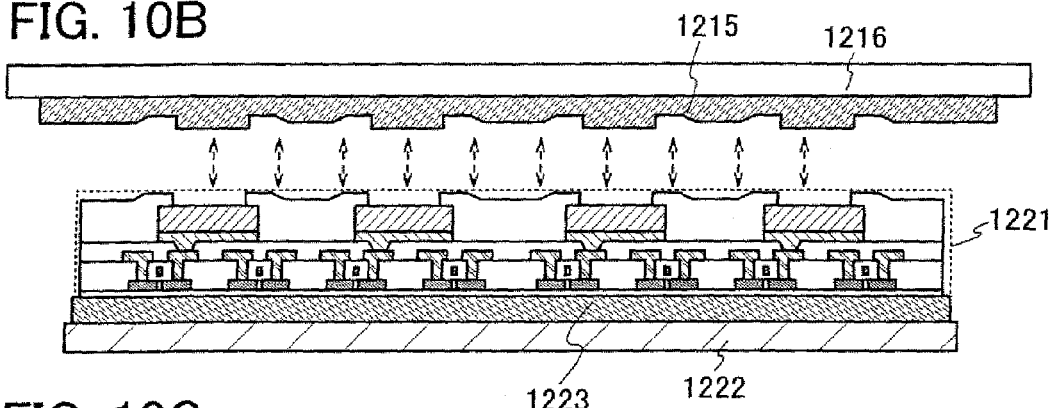

Next, as show, in FIG. 10B, a flexible substrate 1222 is attached to the insulating layer 1203 in the part 1221 of the element formation layer. As the flexible substrate 1222, the substrate 111 illustrated in Embodiment Mode 1 can be used as appropriate.

As a method of attaching the flexible substrate 1222 to the insulating layer 1203, there are a method of attaching the flexible substrate 1222 to the insulating layer 1203 with an adhesive agent, and a method of attaching the flexible substrate 1222 to the insulating layer 1203 including the steps of heating the flexible substrate 1222 so that it is partially melted, and cooling the flexible substrate 1222. Note that the adhesive strength between the insulating layer 1203 and the flexible substrate 1222 is set higher than the adhesive strength between the adhesive agent 1215, the support base 1216, and the element formation layer 1210. In the case of attaching the flexible substrate 1222 to the insulating layer 1203 with an adhesive agent, a material having higher adhesive power than the adhesive agent 1215 is selected as appropriate. Here, the flexible substrate 1222 is attached to the insulating layer 1203 with an adhesive agent 1223. Next, the support base 1216 is peeled off the part 1221 of the element formation layer. Here, the adhesive agent 1215 is peeled off the part 1221 of the element formation layer by applying heat.

Figure 10C:
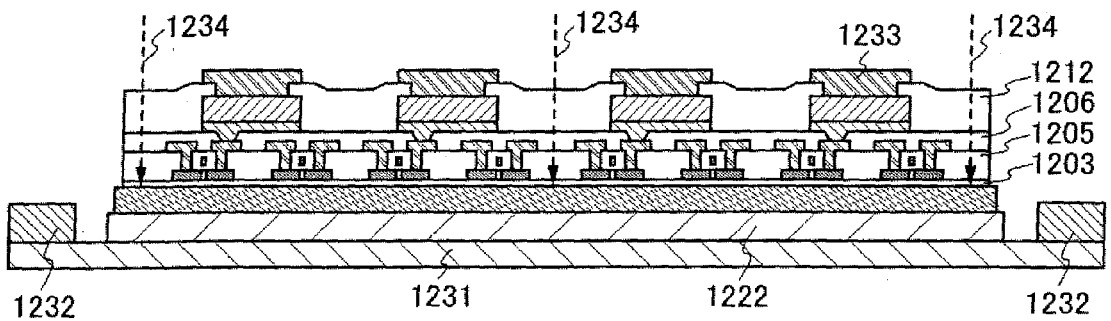

Next, as shown in FIG. 10C, the flexible substrate 1222 is attached to a UV tape 1231 on a dicing frame 1232. Since the UV tape 1231 has an adhesive property, the flexible substrate 1222 is fixed on the UV tape 1231. After that, the conductive layer 1211 may be irradiated with a laser beam so that the adhesion between the conductive layer 1211 and the conductive layer 1208 is increased.

Next, a connection terminal 1233 is formed on the conductive layer 1211. Forming the connection terminal 1233 can facilitate the later process of aligning and attaching a conductive layer functioning as an antenna.

Figure 10D:
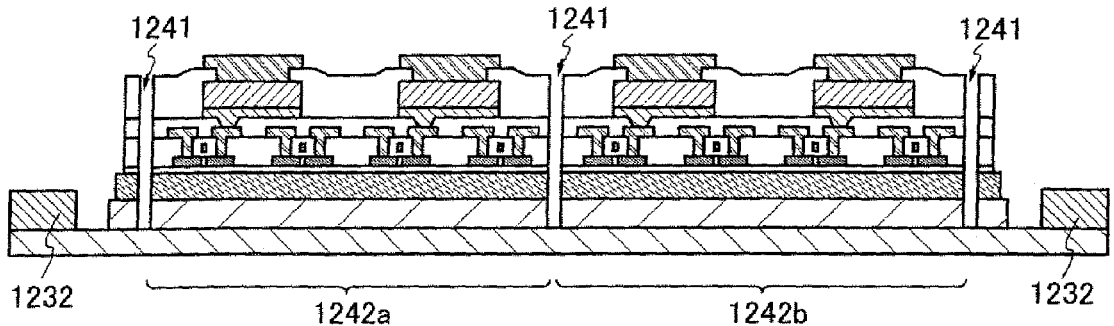

Next, as shown in FIG. 10D, the part 1221 of the element formation layer, the flexible substrate 1222, and the second adhesive agent 1223 are cut. Here, the part 1221 of the element formation layer and the flexible substrate 1222 are irradiated with laser beams 1234 to form grooves 1241 as shown in FIG. 10D, thereby the part 1221 of the element formation layer is divided into a plurality of sections. As the laser beams 1234, laser beams described for the laser beams 1213 can be used as appropriate. Here, laser beams which can be absorbed by the insulating layers 1203, 1205, 1207, and 1212, and the flexible substrate 1222 are preferably used. Note that although the part of the element formation layer is cut into a plurality of sections by a laser ablation method, a dicing method, a scribing method, or the like can be used as appropriate instead of the laser ablation method. Note also that in the case of using fibrous paper as the flexible substrate 1222, it is preferable not to use water in cutting the element formation layer by a dicing method, but to blow gas to the portions to be cut so that dust produced by cutting can be blown away. As a result, the element formation layer and the paper can be prevented from being separated from each other. Furthermore, by conducting dicing while blowing high-humidity gas onto the portions to be cut, the element formation layer can be prevented form being charged with static electricity. The element formation layers obtained after the cutting are denoted by semiconductor integrated circuits 1242a and 1242b.

Next, after attaching expander frames 1244 onto the UV sheet 1231, the dicing frames 1232 are taken off the UV sheet 1231. At this time, by attaching the expander frames 1244 while stretching the UV tape 1231, the width of each groove 1241 which is formed between the semiconductor integrated circuits 1242a and 1242b can be increased.

Next, the UV tape 1231 on the expander frames 1244 is irradiated with UV light so that the adhesive power of the UV sheet is decreased. Next, using the manufacturing apparatus of a semiconductor device shown in FIGS. 6A to 6C, the expander frames 1244 mounting the semiconductor integrated circuits 1242a and 1242b are fixed with robot arms which are the support means. Next, the semiconductor integrated circuits 1242a and 1242b are picked up from the UV tape 1231 by the holders 204 of the jig (see FIG. 11A).

Next, using the flip-chip means of the manufacturing apparatus of a semiconductor device shown in FIGS. 6A to 6C, the semiconductor integrated circuits 1242a and 1242b are transferred from the holders 204 to the holders 273 of the flip-chip means (see FIG. 11B).

Next, as shown in FIG. 11C, the holders 273 of the flip-chip means are moved by using a controller so that the semiconductor integrated circuits 1242a and 1242b can be positioned opposite antennas 209a and 209b, respectively.

Next, the flip-chip means having the holders 273 and the roller 206 in the manufacturing apparatus of a semiconductor device shown in FIGS. 6A to 6C are moved in the opposite direction to one another, so that the flexible substrate 208 having the antennas 209a and 209b and the semiconductor integrated circuits 1242a and 1242b are attached to each other with the anisotropic conductive film 210 as shown in FIG. 12A. At this time, attachment is conducted so that the antennas 209a and 209b and the connection terminals 1233 of the semiconductor integrated circuits 1242a and 1242b are connected with conductive particles contained in the anisotropic film 210.

Next, as shown in FIG. 12B, at a region where the antennas 209a and 209b and the semiconductor integrated circuits 1242a and 1242b are not formed, the flexible substrate 208 is cut. As a method of cutting, a laser ablation method, a dicing method, a scribing method, or the like can be used as appropriate. Here, cutting is conducted by a laser ablation method by which the anisotropic conductive film 210 and the flexible substrate 208 are irradiated with a laser beam 1251.

Though the above steps, semiconductor devices 1252a and 1252b capable of wireless data transmission can be manufactured.

Through the above steps, semiconductor devices which are thin and lightweight can be manufactured with high yield.

Embodiment 2

Figure 14:
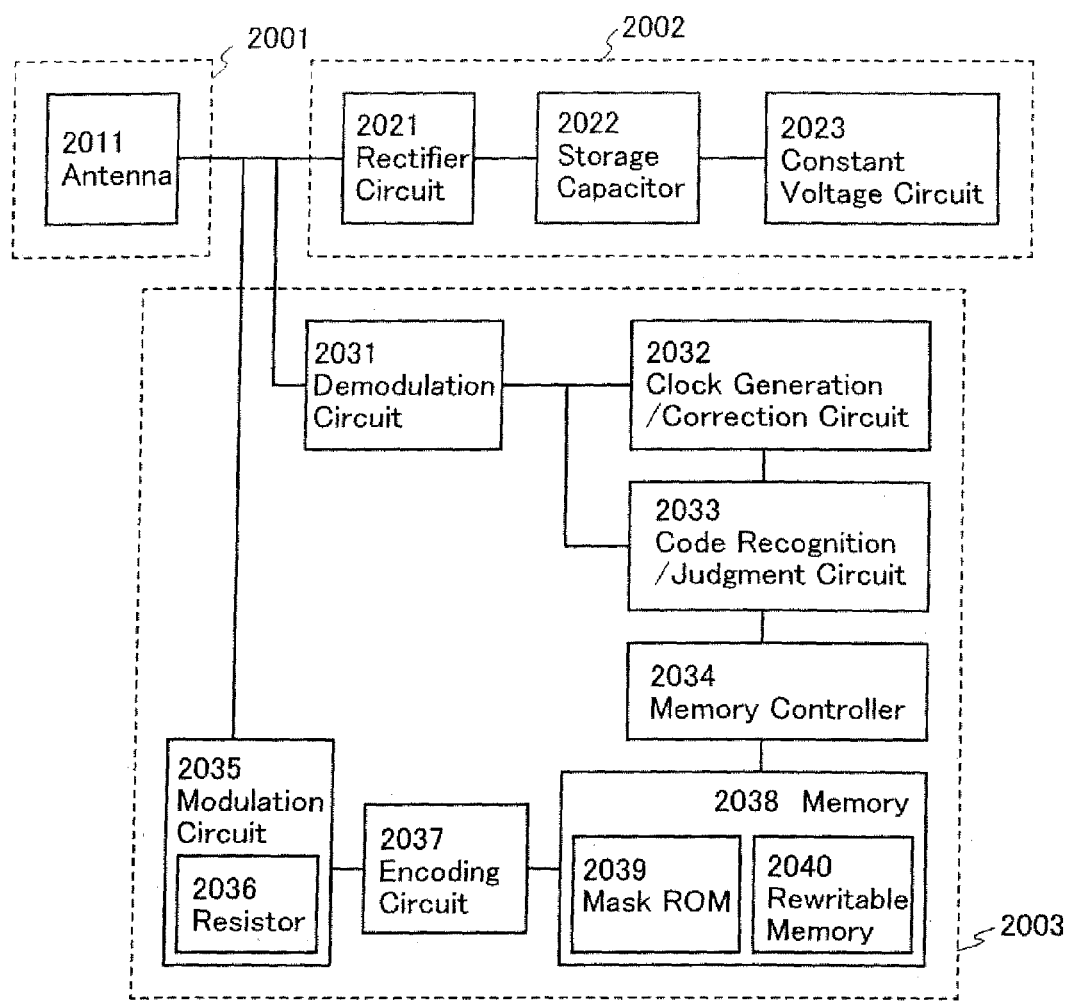
FIG. 14 is a diagram illustrating a semiconductor device of the invention.

In this embodiment, the structure of a semiconductor device capable of wireless data transmission is described with reference to FIG. 14.

The semiconductor device in this embodiment includes an antenna portion 2001, a power supply portion 2002, and a logic portion 2003 as its main components.

The antenna portion 2001 includes an antenna 2011 which receives external signals and transmits data. The signal transmission method of the semiconductor deice can be any of an electromagnetic coupling method, an electromagnetic induction method, and a microwave method.

The power supply portion 2002 includes a rectifier circuit 2021 which produces power from a signal received from outside through the antenna 2011, a storage capacitor 2022 which holds the produced power, and a constant voltage circuit 2023 which produces a constant voltage to be supplied to each circuit.

The logic circuit portion 2003 includes a demodulation circuit 2031 for demodulating received signals, a clock generation/correction circuit 2032 for generating clock signals, a code recognition/judgment circuit 2033, a memory controller 2034 for generating signals for reading out data from a memory based on the received signals, a modulation circuit 2035 for superposing an encoded signal on the received signal, an encoding circuit 2037 for encoding the data read out, and a memory 2038 for storing data. Note that the modulation circuit 2035 includes a resistor 2036 for modulation.

As the memory 2038, a DRAM (Dynamic Random Access Memory), an SRAM (Static Random Access Memory), an FERAM (Ferroelectric Random Access Memory), a mask ROM (Mask Read Only Memory), an EPROM (Electrically Programmable Read Only Memory), an EEPROM (Electrically Erasable and Programmable Read Only Memory), a flash memory, an organic memory, or the like is used as appropriate. Here, a mask ROM 2039 and a rewritable memory 2040 formed from an organic memory are shown as the memory 2038.

A code recognized and judged by the code recognition/judgment circuit 2033 is a frame termination signal (EOF, End of Frame), a frame starting signal (SOF, Start of Frame), a flag, a command code, a mask length, a mask value, and the like. The code recognition/judgment circuit 2033 also has a cyclic redundancy check (CRC) function for discriminating send errors.

Embodiment 3

Figure 15A:
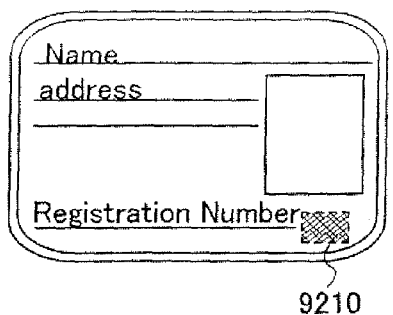
FIGS. 15A to 15F are diagrams illustrating application examples of a semiconductor device of the invention.
Figure 15B:
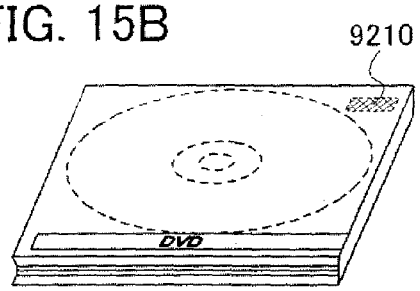
Figure 15C:
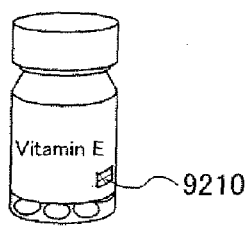
Figure 15D:
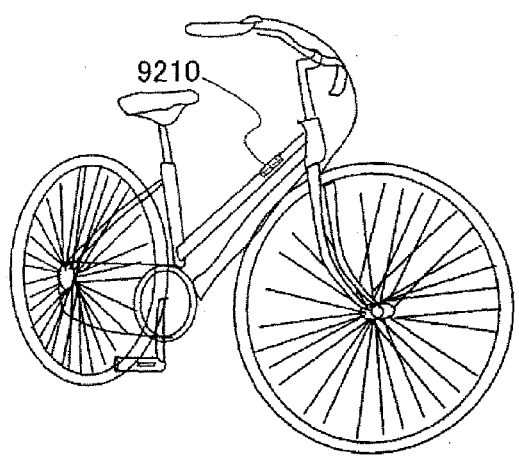
Figure 15E:
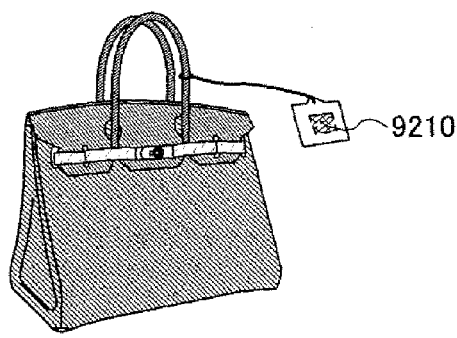
Figure 15F:
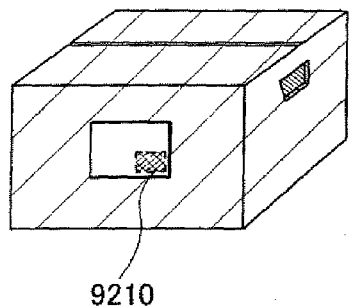

A semiconductor device capable of wireless data transmission as illustrated in the above embodiments can be applied to various uses, such as bills, coins, securities, bearer securities, documents (e.g., driver's licenses or resident's cards, see FIG. 15A), packaging containers (e.g., wrapping paper or bottles, see FIG. 15C), storage media (e.g., DVD software or video tapes, see FIG. 15B), means of transportation (e.g., bicycles, see FIG. 15D), personal ornaments and accessories (e.g., shoes or glasses), foods, clothing, everyday articles, or tags on goods such as electronic devices or on bags (see FIGS. 15E and 15F). Note that electronic devices include a liquid crystal display device, an EL display device, a television set (also simply called as a TV set, a TV receiver, or a television receiver), a mobile phone, and the like. Furthermore, the semiconductor device can also be applied to plants, animals, human bodies, and the like.

The semiconductor devices 9210 in this embodiment are fixed on goods by, for example, being mounted on a printed board, attached to a surface, embedded in goods, or the like. For example, the semiconductor device 9210 can be embedded in paper of a book, or embedded in an organic resin of a package. Since the semiconductor device 9210 in this embodiment can realize a compact size, thin shape, and light weight, it can be fixed on goods without spoiling the design thereof. Further, by applying the semiconductor device 9210 in this embodiment to bills, coins, securities, bearer securities, documents, or the like, authentication functions can be provided, with which forgery can be prevented. In addition, by applying the semiconductor device 9210 in this embodiment to packaging containers, storage media, personal belongings, foods, clothing, everyday articles, electronic devices, and the like, efficiency of systems such as an inspection system can be increased.

The present application is based on Japanese Priority application No. 2006-027737 filed on Feb. 3, 2006 with the Japanese Patent Office, the entire contents of which are hereby incorporated by reference.

What is claimed is:

1. A manufacturing method of a semiconductor device, comprising the steps of:
    setting a plurality of semiconductor integrated circuits on a support means;
    picking up the plurality of semiconductor integrated circuits by using a plurality of holders arranged in a row on a roller;
    rotating a roller for supplying a flexible substrate having a plurality of elements, a roller for controlling a movement of the flexible substrate having the plurality of elements, and a roller for collecting the flexible substrate having the plurality of elements, thereby moving the flexible substrate having the plurality of elements;
    rotating the roller on which the plurality of holders are arranged in a row, so that the plurality of semiconductor integrated circuits are positioned opposite the flexible substrate having the plurality of elements;
    controlling a pitch of the plurality of holders by a controller for controlling the pitch of the plurality of holders so that connection terminals of the plurality of semiconductor integrated circuits are positioned opposite to respective connection terminals of the plurality of elements over the flexible substrate; and
    connecting the connection terminals of the plurality of semiconductor integrated circuits to the respective connection terminals of the plurality of elements by using the roller for controlling the movement of the flexible substrate having the plurality of elements and the roller on which the plurality of holders are arranged in a row.

2. The manufacturing method of a semiconductor device according to claim 1, further comprising the step of:
    cutting the flexible substrate by a cutter, after connecting the connection terminals of the plurality of semiconductor integrated circuits to the respective connection terminals of the plurality of elements by using the roller for controlling the movement of the flexible substrate having the plurality of elements and the roller on which the plurality of holders are arranged in a row.

3. The manufacturing method of a semiconductor device according to claim 1, further comprising the step of:
    attaching another flexible substrate to surfaces of the plurality of semiconductor integrated circuits and the plurality of elements by using a pair of rollers, after connecting the connection terminals of the plurality of semiconductor integrated circuits to the respective connection terminals of the plurality of elements by using the roller for controlling the movement of the flexible substrate having the plurality of elements and the roller on which the plurality of holders are arranged in a row.

4. The manufacturing method of a semiconductor device according to claim 1, further comprising the steps of:
    attaching another flexible substrate to surfaces of the plurality of semiconductor integrated circuits and the plurality of elements by using a pair of rollers, after connecting the connection terminals of the plurality of semiconductor integrated circuits to the respective connection terminals of the plurality of elements by using the roller for controlling the movement of the flexible substrate having the plurality of elements and the roller on which the plurality of holders are arranged in a row; and
    cutting the flexible substrate having the plurality of elements and the other flexible substrate by a cutter.

5. The manufacturing method of a semiconductor device according to claim 1, wherein each of the elements includes at least one of an antenna, a semiconductor integrated circuit, and a sensor.

6. The manufacturing method of a semiconductor device according to claim 1, wherein the roller on which the plurality of holders are arranged in a row does not rotate during the step of picking up the plurality of semiconductor integrated circuits.

7. The manufacturing method of a semiconductor device according to claim 1, wherein the roller on which the plurality of holders are arranged in a row does not rotate during the step of connecting the connection terminals of the plurality of semiconductor integrated circuits to the respective connection terminals of the plurality of elements.

8. A manufacturing method of a semiconductor device, comprising the steps of:
    setting a plurality of semiconductor integrated circuits on a support means;
    picking up the plurality of semiconductor integrated circuits by using a first plurality of holders arranged in a row on a first roller;
    transferring the plurality of semiconductor integrated circuits from the first plurality of holders to a second plurality of holders arranged on a second roller;
    rotating a roller for supplying a flexible substrate having a plurality of elements, a roller for controlling a movement of the flexible substrate having the plurality of elements, and a roller for collecting the flexible substrate having the plurality of elements, thereby moving the flexible substrate having the plurality of elements;
    rotating the second roller on which the second plurality of holders are arranged, so that the plurality of semiconductor integrated circuits are positioned opposite the flexible substrate having the plurality of elements;
    controlling a pitch of the second plurality of holders by a controller for controlling the pitch of the second plurality of holders so that connection terminals of the plurality of semiconductor integrated circuits are positioned opposite to respective connection terminals of the plurality of elements over the flexible substrate; and connecting the connection terminals of the plurality of semiconductor integrated circuits to the respective connection terminals of the plurality of elements by using the roller for controlling the movement of the flexible substrate having the plurality of elements and the second roller on which the second plurality of holders are arranged.

9. The manufacturing method of a semiconductor device according to claim 8, further comprising the step of:

cutting the flexible substrate by a cutter, after connecting the connection terminals of the plurality of semiconductor integrated circuits to the respective connection terminals of the plurality of elements by using the roller for controlling the movement of the flexible substrate having the plurality of elements and the second roller on which the second plurality of holders are arranged.

10. The manufacturing method of a semiconductor device according to claim 8, further comprising the step of:

attaching another flexible substrate to surfaces of the plurality of semiconductor integrated circuits and the plurality of elements by using a pair of rollers, after connecting the connection terminals of the plurality of semiconductor integrated circuits to the respective connection terminals of the plurality of elements by using the roller for controlling the movement of the flexible substrate having the plurality of elements and the second roller on which the second plurality of holders are arranged.

11. The manufacturing method of a semiconductor device according to claim 8, further comprising the steps of:

attaching another flexible substrate to surfaces of the plurality of semiconductor integrated circuits and the plurality of elements by using a pair of rollers, after connecting the connection terminals of the plurality of semiconductor integrated circuits to the respective connection terminals of the plurality of elements by using the roller for controlling the movement of the flexible substrate having the plurality of elements and the second roller on which the second plurality of holders are arranged; and cutting the flexible substrate having the plurality of elements and the other flexible substrate by a cutter.

12. The manufacturing method of a semiconductor device according to claim 8, wherein each of the elements includes at least one of an antenna, a semiconductor integrated circuit, and a sensor.

13. The manufacturing method of a semiconductor device according to claim 8, wherein the roller on which the first plurality of holders are arranged in a row does not rotate during the step of picking up the plurality of semiconductor integrated circuits.

14. The manufacturing method of a semiconductor device according to claim 8, wherein the second roller on which the second plurality of holders are arranged in a row does not rotate during the step of connecting the connection terminals of the plurality of semiconductor integrated circuits to the respective connection terminals of the plurality of elements.

15. A manufacturing method of a semiconductor device, comprising the steps of:

setting semiconductor integrated circuits on a support means;

picking up a first plurality of the semiconductor integrated circuits by using a first plurality of holders arranged in a row on a roller, a second plurality of holders being arranged in a row on the roller, in a position symmetrically opposite to a position of the first plurality of holders;

rotating a roller for supplying a flexible substrate having a plurality of elements, a roller for controlling a movement of the flexible substrate having the plurality of elements, and a roller for collecting the flexible substrate having the plurality of elements, thereby moving the flexible substrate having the plurality of elements;

rotating the roller on which the first plurality of holders are arranged in a row, so that the first plurality of the semiconductor integrated circuits are positioned opposite the flexible substrate having the plurality of elements;

controlling a pitch of the first plurality of holders by a controller for controlling the pitch of the first plurality of holders so that connection terminals of the first plurality of the semiconductor integrated circuits are positioned opposite to respective connection terminals of the plurality of elements over the flexible substrate; and connecting the connection terminals of the first plurality of the semiconductor integrated circuits to the respective connection terminals of the plurality of elements by using the roller for controlling the movement of the flexible substrate having the plurality of elements and the roller on which the first plurality of holders are arranged, and, simultaneously, picking up a second plurality of the semiconductor integrated circuits by using the second plurality of holders.

16. The manufacturing method of a semiconductor device according to claim 15, further comprising the step of:

cutting the flexible substrate by a cutter, after connecting the connection terminals of the plurality of semiconductor integrated circuits to the respective connection terminals of the plurality of elements by using the roller for controlling the movement of the flexible substrate having the plurality of elements and the roller on which the first plurality of holders are arranged in a row.

17. The manufacturing method of a semiconductor device according to claim 15, further comprising the step of:

attaching another flexible substrate to surfaces of the plurality of semiconductor integrated circuits and the plurality of elements by using a pair of rollers, after connecting the connection terminals of the plurality of semiconductor integrated circuits to the respective connection terminals of the plurality of elements by using the roller for controlling the movement of the flexible substrate having the plurality of elements and the roller on which the first plurality of holders are arranged in a row.

18. The manufacturing method of a semiconductor device according to claim 15, further comprising the steps of:

attaching another flexible substrate to surfaces of the plurality of semiconductor integrated circuits and the plurality of elements by using a pair of rollers, after connecting the connection terminals of the plurality of semiconductor integrated circuits to the respective connection terminals of the plurality of elements by using the roller for controlling the movement of the flexible substrate having the plurality of elements and the roller on which the first plurality of holders are arranged in a row; and cutting the flexible substrate having the plurality of elements and the other flexible substrate by a cutter.

19. The manufacturing method of a semiconductor device according to claim 15, wherein each of the elements includes at least one of an antenna, a semiconductor integrated circuit, and a sensor.

20. A manufacturing method of a semiconductor device, comprising the steps of:
- setting semiconductor integrated circuits on a support means;
- picking up a first plurality of the semiconductor integrated circuits by using a first plurality of holders arranged in a row on a roller, a second plurality of holders being arranged in a row on the roller;
- rotating a roller for supplying a flexible substrate having a plurality of elements, a roller for controlling a movement of the flexible substrate having the plurality of elements, and a roller for collecting the flexible substrate having the plurality of elements, thereby moving the flexible substrate having the plurality of elements;
- rotating the roller on which the first plurality of holders are arranged in a row, so that the second plurality of holders are positioned opposite to the support means;
- picking up a second plurality of the semiconductor integrated circuits by using the second plurality of holders, rotating the roller on which the first plurality of holders are arranged in a row, so that the first plurality of the semiconductor integrated circuits are positioned opposite the flexible substrate having the plurality of elements;
- controlling a pitch of the first plurality of holders by a controller for controlling the pitch of the first plurality of holders so that connection terminals of the first plurality of the semiconductor integrated circuits are positioned opposite to respective connection terminals of the plurality of elements over the flexible substrate; and
- connecting the connection terminals of the first plurality of the semiconductor integrated circuits to the respective connection terminals of the plurality of elements by using the roller for controlling the movement of the flexible substrate having the plurality of elements and the roller on which the first plurality of holders are arranged, while holding the second plurality of the semiconductor integrated circuits by using the second plurality of holders.

21. The manufacturing method of a semiconductor device according to claim 20, further comprising the step of: cutting the flexible substrate by a cutter, after connecting the connection terminals of the plurality of semiconductor integrated circuits to the respective connection terminals of the plurality of elements by using the roller for controlling the movement of the flexible substrate having the plurality of elements and the roller on which the first plurality of holders are arranged in a row.

22. The manufacturing method of a semiconductor device according to claim 20, further comprising the step of:
- attaching another flexible substrate to surfaces of the plurality of semiconductor integrated circuits and the plurality of elements by using a pair of rollers, after connecting the connection terminals of the plurality of semiconductor integrated circuits to the respective connection terminals of the plurality of elements by using the roller for controlling the movement of the flexible substrate having the plurality of elements and the roller on which the first plurality of holders are arranged in a row.

23. The manufacturing method of a semiconductor device according to claim 20, further comprising the steps of:
- attaching another flexible substrate to surfaces of the plurality of semiconductor integrated circuits and the plurality of elements by using a pair of rollers, after connecting the connection terminals of the plurality of semiconductor integrated circuits to the respective connection terminals of the plurality of elements by using the roller for controlling the movement of the flexible substrate having the plurality of elements and the roller on which the first plurality of holders are arranged in a row; and
- cutting the flexible substrate having the plurality of elements and the other flexible substrate by a cutter.

24. The manufacturing method of a semiconductor device according to claim 20, wherein each of the elements includes at least one of an antenna, a semiconductor integrated circuit, and a sensor.

* * * * *

UNITED STATES PATENT AND TRADEMARK OFFICE
CERTIFICATE OF CORRECTION

PATENT NO. : 8,201,329 B2
APPLICATION NO. : 12/792812
DATED : June 19, 2012
INVENTOR(S) : Nakamura et al.

It is certified that error appears in the above-identified patent and that said Letters Patent is hereby corrected as shown below:

Col. 4, line 66, "integrated Circuits" should read --integrated circuits--.

Col. 7, line 53, "robot aim" should read --robot arm--.

Col. 12, line 21, "embodiment anode" should read --embodiment mode--.

Col. 13, line 49, "while bolding" should read --while holding--.

Col. 15, line 33, "can be fanned" should read --can be formed--.

Col. 18, line 39, "FIG. 68" should read --FIG. 6B--.

Col. 20, line 41, "a TOW" should read --a row--.

Col. 21, line 66, "fowled over" should read --formed over--.

Col. 23, line 28, "202*e*" should read --202*c*--.

Col. 24, line 43, "roller 20*b*" should read --roller 20*6*--.

Col. 24, lines 56, 61 and 65, "202*e*" should read --202*c*--.

Col. 30, line 40, "as show" should read --as shown--.

Signed and Sealed this
Eighteenth Day of September, 2012

David J. Kappos
*Director of the United States Patent and Trademark Office*